United States Patent
Kim et al.

(10) Patent No.: US 11,789,254 B2
(45) Date of Patent: Oct. 17, 2023

(54) VERTICALLY-SHIFTING ELECTROSTATIC ACTUATOR AND OPTICAL SCANNER EMPLOYING THE SAME

(71) Applicant: KOREA OPTRON CORP., Gwangju (KR)

(72) Inventors: Yun Goo Kim, Ansan-si (KR); Hwan Sun Kim, Gwangju (KR); Eun Joong Lee, Gwangju (KR); Yong Kook Kim, Seoul (KR)

(73) Assignee: KOREA OPTRON CORP., Gwangju (KR)

( * ) Notice: Subject to any disclaimer, the term of this patent is extended or adjusted under 35 U.S.C. 154(b) by 444 days.

(21) Appl. No.: 17/068,643

(22) Filed: Oct. 12, 2020

(65) Prior Publication Data

US 2021/0132370 A1    May 6, 2021

(30) Foreign Application Priority Data

Oct. 30, 2019  (KR) .................. 10-2019-0136294
Dec. 20, 2019  (KR) .................. 10-2019-0171672

(51) Int. Cl.
*G02B 26/08*    (2006.01)
*B81B 3/00*     (2006.01)
*G02B 26/10*    (2006.01)

(52) U.S. Cl.
CPC ........ *G02B 26/0841* (2013.01); *B81B 3/0062* (2013.01); *G02B 26/105* (2013.01); *B81B 2201/042* (2013.01)

(58) Field of Classification Search
CPC .... G02B 26/10; G02B 26/103; G02B 26/105; G02B 26/101; G02B 26/0833;

(Continued)

(56) References Cited

U.S. PATENT DOCUMENTS

| 8,432,596 B2 | 4/2013 | Murayama et al. |
| 9,383,577 B2 * | 7/2016 | Kim ................. H02N 1/002 |
| 2008/0054758 A1 * | 3/2008 | Tsuboi ............... H02N 1/008 |
| | | 310/309 |

(Continued)

FOREIGN PATENT DOCUMENTS

| CN | 101284642 A * | 10/2008 | ......... G02B 26/0841 |
| EP | 1798195 A2 | 6/2007 | |

(Continued)

OTHER PUBLICATIONS

Extended European Search Report of European Patent Application No. 20201230.8—9 pages (dated Mar. 24, 2021).

(Continued)

*Primary Examiner* — William Choi
*Assistant Examiner* — Ray Alexander Dean
(74) *Attorney, Agent, or Firm* — Knobbe, Martens, Olson & Bear, LLP

(57) ABSTRACT

An optical scanner includes a mirror configured to reflect an incident light and a vertically-shifting electrostatic actuator configured to oscillate the mirror. The electrostatic actuator includes a frame having an installation space in a central portion and a drive electrode, a stationary electrode, a shifter, and a force application part installed in the installation space. Drive electrode fingers in the drive electrode and stationary electrode fingers in the stationary electrode are alternately disposed. The shifter may be connected either between the frame and the drive electrode or between the frame and the stationary electrode and vertically shifts either the drive electrode or the stationary electrode connected to the shifter when a vertical force is applied through the force application part.

13 Claims, 13 Drawing Sheets

(58) Field of Classification Search
CPC .............. G02B 26/085; G02B 26/0816; G02B 6/3584; G02B 26/121; G02B 21/0048; G02B 26/0841; B81B 2201/042; B81B 2203/058; B81B 3/00; B81B 2201/047; B81B 2203/0163; B81B 7/0003; B81B 2203/0145; B81B 3/0062
See application file for complete search history.

(56) References Cited

U.S. PATENT DOCUMENTS

| | | | |
|---|---|---|---|
| 2008/0239429 A1* | 10/2008 | Sandner | G02B 26/0833 359/196.1 |
| 2009/0244668 A1 | 10/2009 | Fujino et al. | |
| 2012/0024453 A1 | 2/2012 | Kato | |

FOREIGN PATENT DOCUMENTS

| | | | |
|---|---|---|---|
| KR | 10-2005-0043423 A | | 5/2005 |
| KR | 10-0682958 B1 | | 2/2007 |
| KR | 10-2011-0107154 A | | 9/2011 |
| KR | 10-1090961 | | 12/2011 |
| KR | 10-2032287 B1 | | 10/2019 |
| WO | WO-2020096125 A1 | * | 5/2020 |

OTHER PUBLICATIONS

Office Action of Korean Patent Application No. 10-2019-0136294—9 pages (dated Feb. 20, 2020).

Notice of Allowance of Korean Patent Application No. 10-2019-0171672—8 pages (dated Feb. 20, 2020).

* cited by examiner

VERTICALLY-SHIFTING ELECTROSTATIC ACTUATOR AND OPTICAL SCANNER EMPLOYING THE SAME

CROSS-REFERENCE TO RELATED APPLICATION

The present application claims priority to Korean Patent Application No. 10-2019-0136294, filed on Oct. 30, 2019, and Korean Patent Application No. 10-2019-0171672, filed on Dec. 20, 2019, in the Korean Intellectual Property Office, which are incorporated herein in their entirety by reference.

BACKGROUND

Technical Field

The present disclosure relates to an optical scanner and, more particularly, to a vertically shifting electrostatic actuator manufactured through a micro electromechanical system (MEMS) fabrication process and an optical scanner employing the same.

Description of Related Technology

Lots of researches have been actively conducted on micro electromechanical system (MEMS) devices which can be manufactured by semiconductor or MEMS fabrication process technologies in various technical fields such as displays, printing apparatuses, precision measurement, and precision processing. In particular, optical scanners are drawing attention in a light display field in which a light incident from a light source is scanned for a predetermined screen area to display an image on the screen and in a scanning field in which s scanning light is emitted by a transmitter and a reflected light is received by a receiver to detect an object to be scanned. Optical scanners can modulate the reflected light and have a lot of advantages such as fast and accurate operation, high response speed, and low power consumption, and can be applied to optical communication devices such as such as a variable optical attenuator (VOA), a 1×N switch, a wavelength selective switch (WSS), and a scalable laser. Besides, the optical scanners can be applied to various fields such as an optical coherence tomography (OCT), a pico projector, a smart headlight, a LiDAR, and a skin care machine.

Korean patent publication No. 10-1090961 published on Dec. 8, 2011, and entitled THE OPTICAL SCANNER AND MANUFACTURING METHOD THEREOF discloses an optical scanner.

The disclosure of this section is to provide background information relating to the invention. Applicant does not admit that any information contained in this section constitutes prior art.

SUMMARY

One aspect of the present disclosure provides a vertically-shifting electrostatic actuator which do not include any cover.

Another aspect of the present disclosure provides a vertically-shifting electrostatic actuator having a changed structure which can be manufactured by a simplified manufacturing process and is suitable for an automated mass production, and an optical scanner including the electrostatic actuator.

Yet another aspect of the present disclosure provides a vertically-shifting electrostatic actuator having a simplified structure and a reduced size, and an optical scanner including the electrostatic actuator.

Additional aspects will be set forth in part in the description which follows and, in part, will be apparent from the description, or may be learned by practice of the presented embodiments.

According to an aspect of an embodiment, an electrostatic actuator for use in an optical scanner, includes: a frame having an installation space in a central portion; a drive electrode having a side coupled to a mirror and another side coupled to the frame in the installation space of the frame, and comprising a drive electrode plate and a plurality of drive electrode fingers formed at an outer side of the drive electrode plate; a stationary electrode coupled to the frame in the installation space of the frame and comprising a plurality of stationary electrode fingers disposed alternately with the plurality of drive electrode fingers; a shifter connected between the frame and the drive electrode and configured to vertically shift the drive electrode connected to the shifter when a vertical force is applied; and a force application part disposed below the shifter and configured to apply the vertical force to the shifter so that the shifter vertically shifts the drive electrode connected to the shifter.

The shifter includes: a shifting plate coupled to the drive electrode; a shifting bar disposed under the shifting plate to transfer the vertical force exerted by the force application part to the shifting plate; a support shaft having one end coupled to the frame and the other end extending toward the shifting plate; and a pair of springs arranged between the other end of the support shaft and the shifting plate and capable of being stretched elastically to allow the shifting plate to shift vertically when the vertical force is applied to the shifting plate.

The shifting bar includes: a main shifting bar elongated in a direction in which the plurality of stationary electrode fingers are extending; and a pair of branch shifting bars extending from the main shifting bar in a direction parallel with an axis of the support shaft.

Each of the branch shifting bars may include a portion connected to an end of the main shifting bar and extending toward an area where the plurality of stationary electrode fingers are formed.

The shifting bar may have a shape of an "L"-shape, a "T"-shape, an "H"-shape, a cross shape, and their combination at intersections of the main shifting bar and the branch shifting bar.

The shifting plate may include: a body plate under which the shifting bar is disposed; and a pair of connecting pieces protruding from both ends of the body plate to be parallel with the support shaft and coupled to respective one of the springs.

The pair of branch shifting bars may be formed under the pair of connecting pieces.

The pair of springs may be zigzag-bent springs arranged symmetrically with respect to the support shaft.

The force application part may include: an attachment plate attached to a lower portion of the frame; and a pushing plate positioned within the installation space of the frame and protruding from an upper surface of the attachment plate and configured to push the shifting bar upwards so that the shifter is shifted vertically.

The mirror may be attached on the drive electrode plate.

The drive electrode may further include a mirror attachment plate to which the mirror is attached. In such a case, the drive electrode plate may be coupled to both sides of the mirror attachment plate.

The stationary electrode may include: a stationary electrode plate disposed to face an outer surface of the drive electrode plate on which the plurality of drive electrode fingers are formed; and the plurality of stationary electrode fingers formed on the stationary electrode plate and disposed alternately with the plurality of drive electrode fingers. The stationary electrode plate may also serve as the shifting plate.

The electrostatic actuator may further include a vertical guide formed between the stationary electrode plate and the frame to guide the vertical shifting of the stationary electrode driven by the force application part.

The vertical guide may include at least one protrusion formed in the stationary electrode plate or the frame and at least one groove formed in the frame or the stationary electrode plate correspondingly to the at least one protrusion.

According to another aspect of an embodiment, an optical scanner includes: a mirror configured to reflect an incident light; and an aforementioned electrostatic actuator configured to oscillate the mirror.

According to the present disclosure, the stationary electrode and the drive electrode are shifted apart from each other by applying the vertical force from a lower portion of the stationary electrode and the drive electrode and lifting either the stationary electrode or the drive electrode upwards. Thus, it may be unnecessary to dispose a cover on the top of the electrostatic actuator and it is possible to eliminate potential issues that may be caused by the unnecessary cover.

According to the present disclosure, it is possible to minimize misalignment between the stationary electrode and the drive electrode that may occur in the process of forming a displacement of relative position between the stationary electrode and the drive electrode.

In case that the drive electrode is shifted in the vertical direction with respect to the stationary electrode, most of the space occupied by the stationary electrode may be used for both the stationary electrode fingers and the drive electrode fingers. Thus, the stationary electrode fingers and the drive electrode fingers can be formed to be sufficiently long, which may enhance the efficiency of the activation.

The shape of the shifting bar which vertically shifts the stationary electrode plate may be determined to be an "L"-shape, a "T"-shape, an "H"-shape, a cross shape, or another shape depending on the shape of the stationary electrode plate. Thus, the shifting bar can stably support the stationary electrode plate while preventing the stationary electrode from being slanted.

In addition, a vertical guide may be provided between the stationary electrode plate and the side frame for suppressing any undesired movement or slanting of the stationary electrode in the process of shifting the stationary electrode vertically by the shifter. The vertical guide guides the movement of the stationary electrode so that the stationary electrode is stably shifted in the vertical direction.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings.

Figure 1:
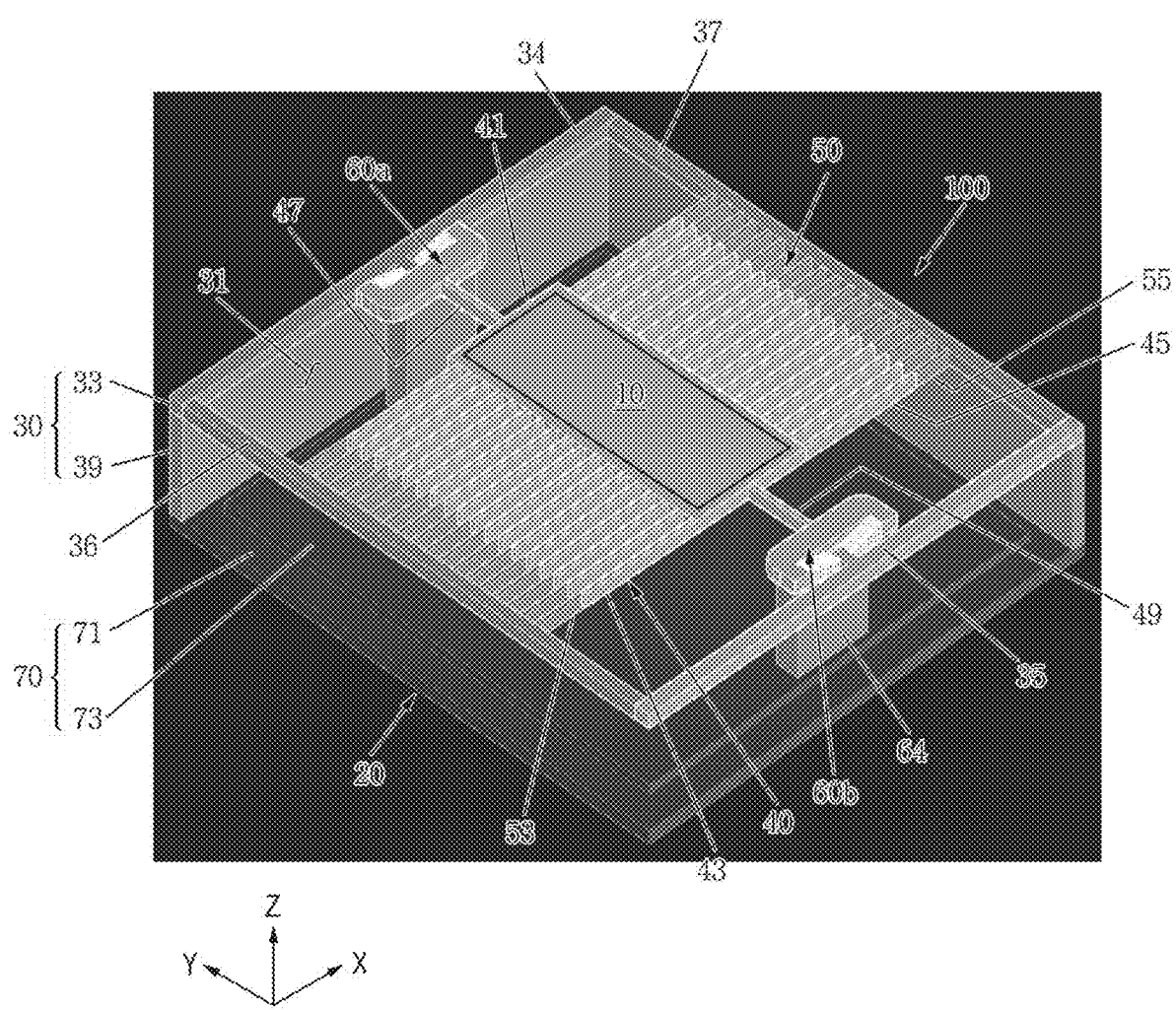
FIG. 1 is a perspective view of an optical scanner having a vertically-shifting electrostatic actuator according to a first embodiment of the present disclosure.

The drawings described herein are for illustration purposes only and are not intended to limit the scope of the present disclosure in any way.

DETAILED DESCRIPTION

In the following description, only parts necessary for understanding embodiments of the present disclosure will be described, and descriptions of other parts may be omitted so as not to obscure the subject matter of the present disclosure.

The terms and words used in the following description and appended claims are not necessarily to be construed in an ordinary sense or a dictionary meaning, and may be appropriately defined herein to be used as terms for describing the present disclosure in the best way possible. Such terms and words should be construed as meaning and concept consistent with the technical idea of the present disclosure. Therefore, the embodiments described in the present specification and the configurations illustrated in the drawings are merely examples, embodiments of the present disclosure and are not intended to limit the scope of the present disclosure, and various equivalents and modifications may be made from the illustrative embodiments.

A micro optical scanner is generally implemented in a form of a single chip with a mirror for reflecting light and an electrostatic actuator for oscillating the mirror using semiconductor or MEMS process technologies.

The electrostatic actuator has a structure that a drive electrode is formed in a direction parallel to a plane of a stage or a moving structure, and a fixed electrode is formed in the direction parallel to the plane of the stage similarly to the drive electrode and is disposed alternately with the drive electrode.

In the electrostatic actuator, a difference in inclination is provided between the drive electrode and the fixed electrode so as to enable a rotational motion by the electrostatic force. The difference in inclination, however, requires an additional process of differentiating heights of the drive electrode and the fixed electrode or tilting either the drive electrode or the fixed electrode after forming the drive electrode and the fixed electrode having the same height as each other.

In one implementation of an optical scanner, the optical scanner has a configuration that a drive electrode is inclined at a predetermined angle with respect to a fixed electrode by pressing a device part positioned under the device part by a cover part including pillars. Here, the device part includes a mirror, a support shaft to which a lever is coupled, and an electrostatic actuator. When the cover part is being coupled to the device part, the pillars press the lever downwards so that the support shaft coupled to the lever rotates by a predetermined angle. As a result, the drive electrode of the electrostatic driver is inclined at a predetermined angle with respect to the fixed electrode.

In this optical scanner, however, since the cover part is coupled on the device part including the electrostatic actuator, the cover part may need to be made of a transparent material or may need to be precisely aligned with the cover part to stably assemble the cover part on the top of the device part and operate the device. Also, since the cover part may affect or interfere with a path of light incident on or reflected by the mirror, it may be necessary to pay attention to a precise design of the cover part disposed on the top of the device part. In addition, due to the necessity of aligning the cover part with the device part while the optical scanner is assembled, the manufacturing process of the optical scanner is complicated and thus the device may not be suitable for an automated mass production.

Hereinbelow, embodiments of the present disclosure are described in detail with reference to the attached drawings.

First Embodiment

Figure 2:
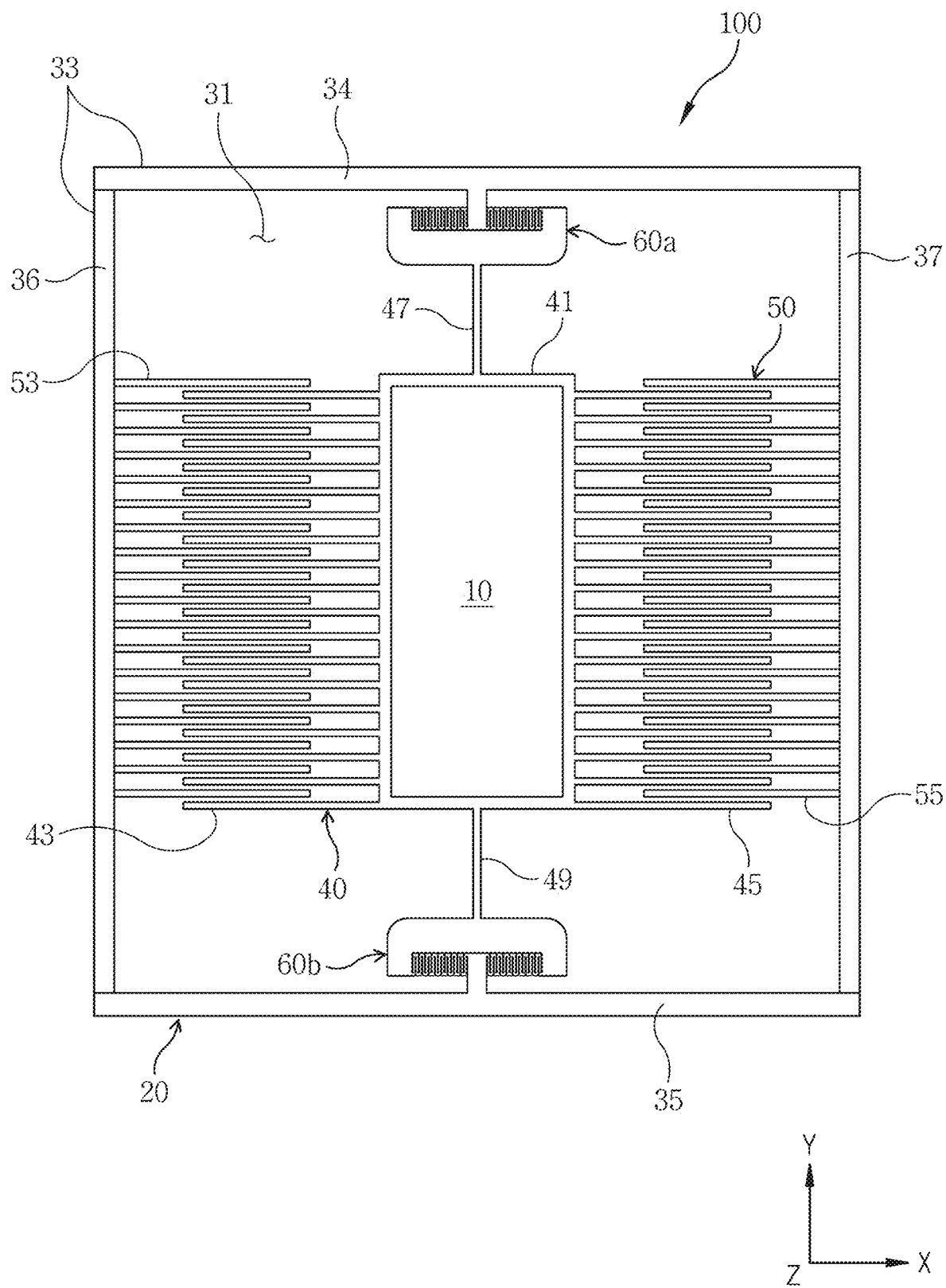
FIG. 2 is a plan view of the optical scanner of FIG. 1.
Figure 3:
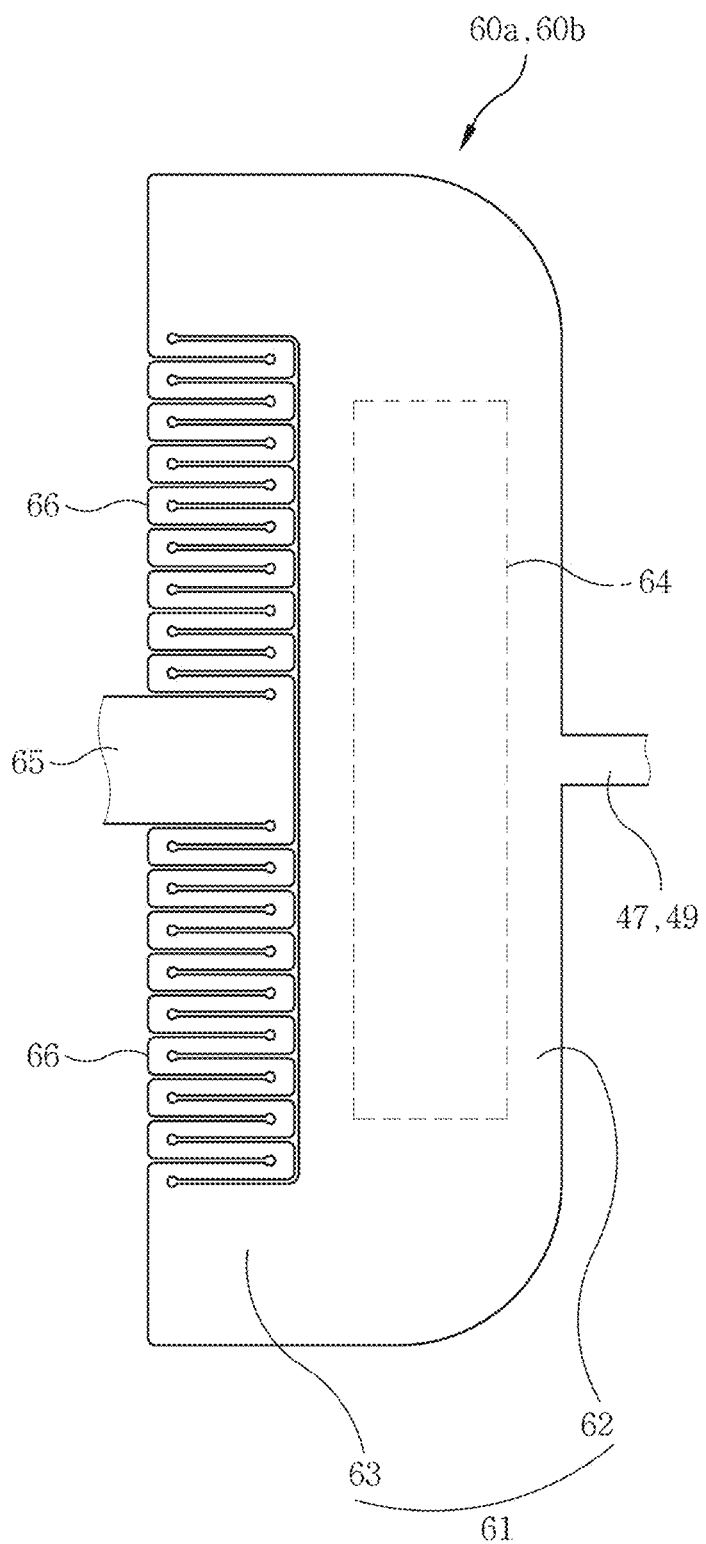
FIG. 3 is an enlarged view of a portion where a shifter shown in FIG. 1 is installed.
Figure 4:
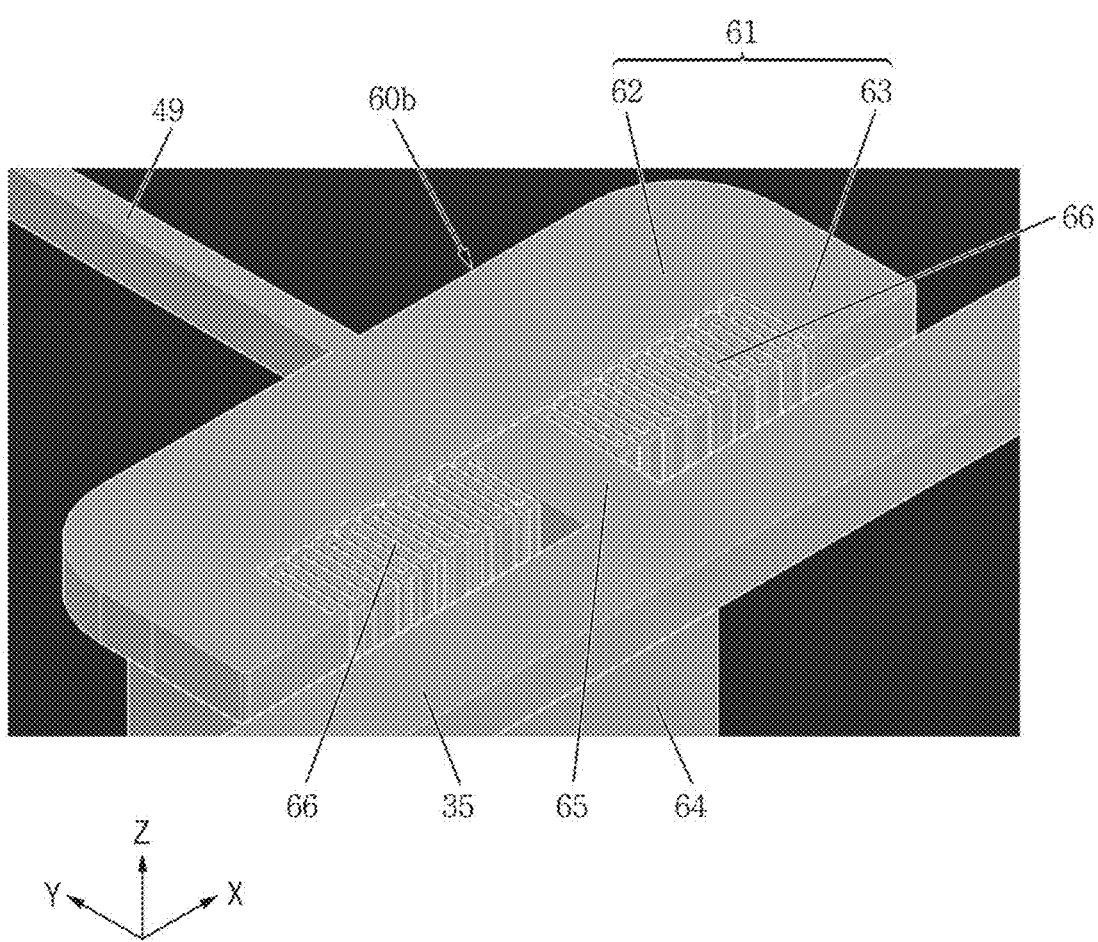
FIG. 4 is a perspective view showing a state before the shifter shown in FIG. 1 is shifted in a vertical direction.
Figure 5:
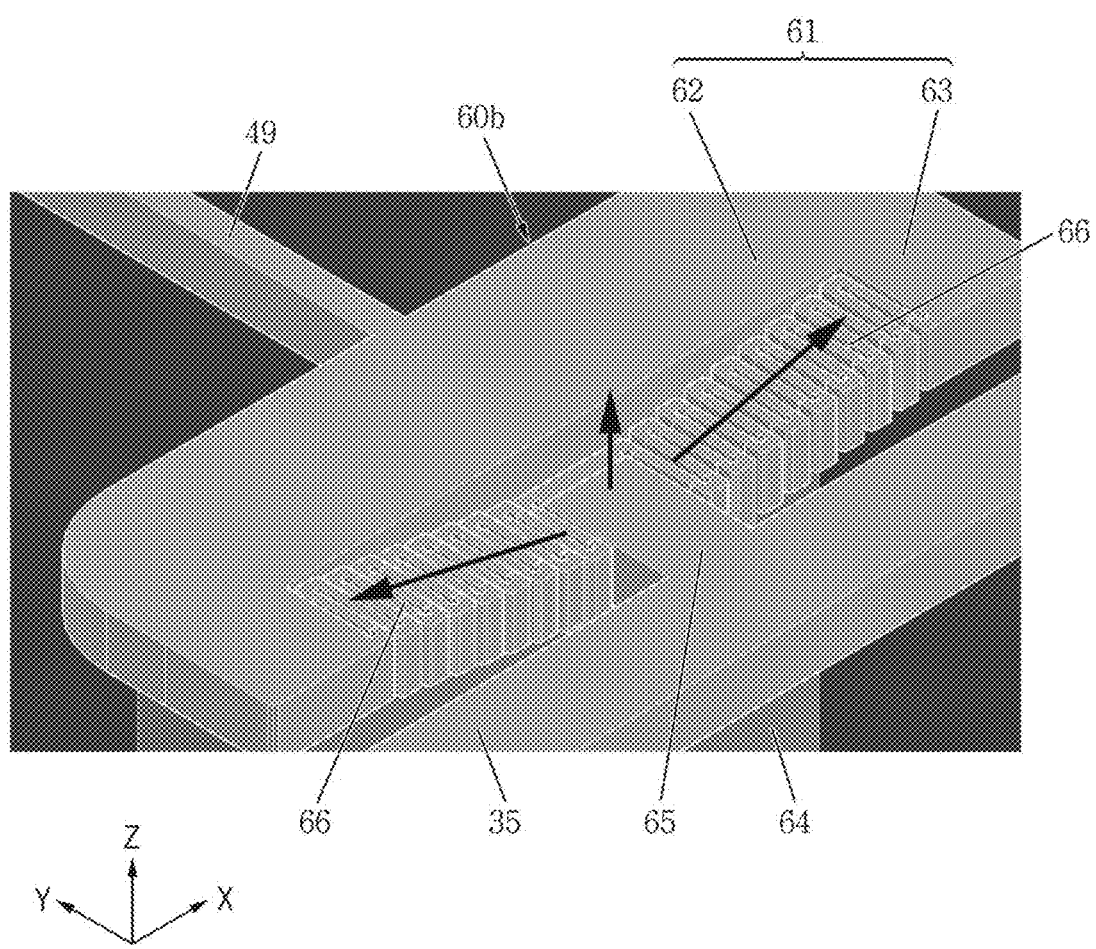
FIG. 5 is a perspective view showing a state in which the shifter shown in FIG. 1 is shifted in the vertical direction by a force application part.

FIG. 1 is a perspective view of an optical scanner having a vertically-shifting electrostatic actuator according to a first embodiment of the present disclosure; FIG. 2 is a plan view of the optical scanner of FIG. 1; FIG. 3 is an enlarged view of a portion in which a shifter shown in FIG. 1 is installed; FIG. 4 is a perspective view showing a state before the shifter shown in FIG. 1 is shifted in a vertical direction; and FIG. 5 is a perspective view showing a state in which the shifter shown in FIG. 1 is shifted in the vertical direction by a force application part. In FIG. 1, a support frame 39 of a frame 30 is partially cut out in order to show a structure installed in an installation space 31 in the frame 30.

Referring to FIGS. 1 through 5, an optical scanner 100 according to a first embodiment of the present disclosure, which is a micro electromechanical system (MEMS) scanner manufactured through a MEMS fabrication process, includes a mirror 10 reflecting an incident light and an electrostatic actuator 20 oscillating the mirror 10.

The electrostatic actuator 20 according to the first embodiment includes the frame 30 which has the installation space 31 in its central portion. The electrostatic actuator 20 further includes a drive electrode 40, a stationary electrode 50, shifters 60a and 60b, and a force application part 70. The drive electrode 40 includes a drive electrode plate 41 coupled to the mirror 10, and a plurality of drive electrode fingers 43 and 45 each of which has one end coupled to the drive electrode plate 41 and the other end extending from opposite sides of the drive electrode plate 41 toward the frame 30 in the installation space 31 of the frame 30. The stationary electrode 50 includes a plurality of stationary electrode fingers 53 and 55 each of which has one end coupled to the frame 30 and the other end extending from the frame 30 to the mirror 10 to be disposed alternately with the plurality of drive electrode fingers 43 and 45 in the installation space 31 of the frame 30. The shifters 60a and 60b are connected either between the frame 30 and the drive electrode 40 or between the frame 30 and the stationary electrode 50. When a vertical force is applied, the shifters 60a and 60b are shifted vertically to displace either the drive electrode 40 or the stationary electrode 50 connected to the shifters 60a and 60b vertically. The force application part 70 is disposed below the shifters 60a and 60b to apply the vertical force to the shifters 60a and 60b, so that the shifters 60a and 60b vertically shift either the drive electrode 40 or the stationary electrode 50 connected to the shifters 60a and 60b according to the vertical force.

In the first embodiment, the shifters 60a and 60b are connected between the drive electrode 40 and the frame 30 for illustrative purpose. Thus, the shifters 60a and 60b vertically may shift the drive electrode 40 upwards with respect to the stationary electrode 50.

Each part of the optical scanner 100 according to the present embodiment will now be described in detail.

The mirror 10 is coupled to the drive electrode 40, and reflects an incident light while oscillating in a certain angular range according to a magnitude of a driving voltage applied to the stationary electrode 50.

The electrostatic actuator 20 can be manufactured through the MEMS manufacturing process based on a silicon-on-insulator (SOI) substrate and a wafer. In detail, the frame 30, the drive electrode 40, the stationary electrode 50, and the shifters 60a and 60b are manufactured based on the SOI substrate while the force application part 70 is manufactured based on the wafer.

The frame 30 has the installation space 31 in its central portion, and the drive electrode 40, the stationary electrode 50, and the shifters 60a and 60b are installed in the installation space 31. In other words, the frame 30 is placed outside the drive electrode 40 and the stationary electrode 50. The drive electrode 40 is rotatably coupled to the frame 30 through the shifters 60a and 60b. The plurality stationary electrode fingers 53 and 55 of the stationary electrode 50 are directly coupled to the frame 30.

The frame 30 includes a side frame 33 and a support frame 39. The side frame 33 has a thickness corresponding to those of the drive electrode 40, the stationary electrode 50, and a shifting plate 61 of the shifters 60a and 60b. The support frame 39 is arranged under the side frame 33 to support the side frame 33. The force application part 70 is attached to a lower portion of the support frame 39. An insulating silicon oxide ($SiO_2$) film is interposed between the side frame 33 and the support frame 39. The side frame 33 and the support frame 39 are formed based on the silicon substrate. The support frame 39 is thicker than the side frame 33 so as to stably support the side frame 33.

The frame 30 may have shape of a tube. The shifters 60a and 60b suitable for shifting the drive electrode 40 in the vertical direction and a pushing plate 73 of the force application part 70 suitable for applying the vertical force to the shifters 60a and 60b are placed in the installation space 33. The drive electrode 40 and the stationary electrode 50 connected to the side frame 33 are placed in the installation space 31 and driven by an electrostatic force. Although the frame 30 is illustrated to have a shape of a square tube in the first embodiment, the present disclosure is not limited thereto.

The side frame 33 includes a pair of first side frames 34 and 35 and a pair of second side frames 36 and 37 electrically isolated from the pair of first side frames 34 and 35. The pair of first side frames 34 and 35 are coupled to the drive electrode 40 and may be connected to a ground potential. The pair of second side frames 36 and 37 are coupled to the plurality of stationary electrode fingers 53 and 55 formed on both sides of the drive electrode 40. The pair of second side frames 36 and 37 may be connected to one or more power sources to receive the driving voltage. For example, one of the second side frames 36 and 37 may be connected to a positive power source while the other one of the second side frames 36 and 37 may be connected to a negative power source.

Of the two first side frames 34 and 35, the first side frame 34 refers to a frame positioned in an upper portion in FIG. 2, and the first side frame 35 refers to a frame positioned in a lower portion in FIG. 2. Of the two second side frames 36 and 37, the second side frame 36 refers to a frame positioned in a left portion in FIG. 2, and the second side frame 37 refers to a frame positioned in a right portion in FIG. 2.

The drive electrode 40 includes the drive electrode plate 41 and the plurality of drive electrode fingers 43 and 45, and may further include a pair of torsion shafts 47 and 49 connected to the shifters 60a and 60b.

The mirror 10 may be attached on the drive electrode plate 41. The plurality of drive electrode fingers 43 and 45 are formed along opposite sides of the drive electrode plate 41. The plurality of drive electrode fingers 43 and 45 include a plurality of first drive electrode fingers 43 extending from one side of the drive electrode plate 41 and a plurality of second drive electrode fingers 45 extending from another side of the drive electrode plate 41 opposite to the side from which the first drive electrode fingers 43 are extending.

The torsion shafts 47 and 49 extend from the other sides of the drive electrode plate 41 adjacent to the sides from which the drive electrode fingers 43 and 45 are extending, and are coupled to the first side frames 34 and 35 via the shifters 60a and 60b, respectively. The torsion shafts 47 and 49 includes a first and a second torsion shafts 47 and 49.

The torsion shafts 47 and 49 are located on an imaginary straight line passing through a center of the drive electrode plate 41 and acts as a rotational axis of the mirror 10 when the mirror 10 attached to the drive electrode plate 41 rotates clockwise or counterclockwise. In embodiments, the torsion shafts 47 and 49 guide a rotation or tilting of the mirror 10 in a certain angular range when the mirror 10 rotates by the driving voltage applied to the stationary electrode 50. When the driving voltage applied to the stationary electrode 50 is removed, the torsion shafts 47 and 49 rotates the mirror 10 in a reverse direction by an elastic force resulting from an accumulated elastic potential energy to restore an orientation of the mirror.

The plurality of first drive electrode fingers 43 and the plurality of second drive electrode fingers 45 extend from the sides of the drive electrode plate 41 disposed to be parallel with the imaginary straight line passing through the torsion shafts 47 and 49.

The plurality of stationary electrode fingers 53 and 55 of the stationary electrode 50 includes a plurality of first stationary electrode fingers 53 disposed to alternate with the plurality of first drive electrode fingers 43, and a plurality of second stationary electrode fingers 55 disposed to alternate with the plurality of second driving fingers 45. The plurality of first and second stationary electrode fingers 53 and 55 are directly coupled to the second side frames 36 and 37, respectively. In embodiments, each of the plurality of first and second stationary electrode fingers 53 and 55 has one end coupled to the second side frames 36 and 37. The other ends of the plurality of first and second drive electrode fingers 43 and 45 are disposed to alternate with the plurality of first and second drive electrode fingers 43 and 45.

Meanwhile, although the plurality of stationary electrode fingers 53 and 55 are directly coupled to the second side frames 36 and 37 in the first embodiment, the present disclosure is not limited thereto. For example, the plurality of stationary electrode fingers 53 and 55 may be coupled to the second side frames 36 and 37 via a stationary electrode plate connecting the plurality of stationary electrode fingers 53 and 55.

In addition, although the plurality of drive electrode fingers 43 and 45 are coupled to the drive electrode plate 41 to which the mirror 10 is attached, the present disclosure is not limited thereto. For example, the plurality of drive electrode fingers 43 and 45 may be coupled to the torsion shafts which are coupled to the drive electrode plate.

The shifters 60a and 60b are disposed between the drive electrode 40 and the pair of first side frames 34 and 35 to shift the drive electrode 40 vertically when the vertical force is applied. In embodiments, the shifters 60a and 60b shift the drive electrode 40 formed on an xy-plane in a direction parallel to the z-axis (hereinbelow, referred to as 'z-axis direction'). The shifters 60a and 60b are arranged on both sides of the drive electrode 40 so that there is little slanting of the drive electrode 40 with respect to the xy-plane when the drive electrode 40 is shifted in the z-axis direction.

The shifters 60a and 60b include a first shifter 60a and a second shifter 60b. The first shifter 60a is disposed between the first torsion shaft 47 and the first side frame 34, and the second shifter 60b is disposed between the second torsion shaft 49 and the first side frame 35.

Each of the first and second shifters 60a and 60b includes the shifting plate 61, a shifting bar 64, a support shaft 65, and a pair of springs 66. The shifting plate 61 is coupled to the torsion shafts 47 and 49 of the drive electrode 40. The shifting bar 64 is disposed under the shifting plate 61 and transfers the vertical force exerted by the force application part 70 to the shifting plate 61. The support shaft 65 has one end coupled to the first side frame 34 or 35 and the other end extending toward the shifting plate 61. The springs 66 extend laterally from the other end of the support shaft 65 and are coupled to the shifting plate 61. When the vertical force is applied to the shifting plate 61, both of the springs 66 may be stretched elastically so that the shifting plate 61 can be shifted in the vertical direction according to the vertical force.

The shifting plate 61 includes a body plate 62 and a pair of connecting pieces 63. The body plate 62 is a portion under which the shifting bar 64 is disposed. The connecting pieces 63 protrude from both outer ends of the body plate 62 to be parallel with the support shaft 65. The springs 66 are disposed between the support shaft 65 and the connecting pieces 63.

The shifting plate 61 may be formed to be wider than the width of the torsion shafts 47 and 49. In embodiments, the width of the shifting plate 61 in the x-axis direction may be wider than the width of the torsion shafts 47 and 49 in the y-axis direction. The shifting plate 61 is formed symmetrically with respect to the torsion shafts 47 and 49.

The shifting bar 64 is formed to be wider than the width of the torsion shafts 47 and 49 so as to shift the shifting plate 61 stably in the z-axis direction. Also, the shifting bar 64 supports the shifting plate 61 so that the shifting plate 61 does not rotate when the drive electrode 40 rotates clockwise and counterclockwise by a certain angle.

The support shaft 65 is formed such that its axial center coincides with axial centers of the torsion shafts 47 and 49. In embodiments, since the torsion shafts 47 and 49 elongates in the y-axis direction, the support shaft 65 also elongates in the y-axis direction.

The springs 66 may be zigzag-bent springs arranged symmetrically with respect to the support shaft 65. In detail, the springs 66 are formed to be symmetrical with respect to the support shaft 65 so as to move the drive electrode 40 stably moved in the z-axis direction according to the vertical force acting on the shifting plate 61. Zigzag patterns of the springs 66 elongates in the x-axis direction so as to stably and elastically support the shifting plate 61 moving in the z-axis direction. When the shifting plate 61 is shifted in the z-axis direction, the springs 66 are stretched to be inclined by a certain angle around the support shaft 65 in an xz-plane.

The force application part 70 has a shape of a plate, of which edge portion is attached to the support frame 39. A central portion of the force application part 70 shifts the shifters 60a and 60b in the z-axis direction. The central portion of an upper surface of the force application part 70 may be protruded upwards compared to an edge portion of the force application part 70 so as to facilitates an operation of pushing the shifters 60a and 60b upward, i.e., in the z-axis direction. The force application part 70 includes an attachment plate 71 and the pushing plate 73. The attachment plate 71 may be attached to a lower portion of the support frame 39. The pushing plate 73, which is positioned within the installation space 31 of the frame 30 and protrudes from the upper surface of the attachment plate 71, may shift the shifters 60a and 60b in the vertical direction by pushing the shifting bar 64 upwards.

The attachment plate 71 may be attached to the lower portion of the support frame 39 by using an adhesive and close the lower portion of the support frame 39. A silicone adhesive, an ultraviolet epoxy adhesive, a thermosetting epoxy adhesive, or the like may be used as the adhesive.

The pushing plate 73 is formed to protrude from the upper surface of the attachment plate 71. In a state that the attachment plate 71 is attached to the support frame 39, the pushing plate 73 may push the shifting bar 64 upward to shift the shifters 60a and 60b in the vertical direction. At this time, the pushing plate 73 may shift the shifters 60a and 60b in the z-axis direction by a distance corresponding to a height difference between the attachment plate 71 and the pushing plate 73. In embodiments, the height difference between the attachment plate 71 and the pushing plate 73 may be determined to be a height by which the pushing plate 73 shifts the shifters 60a and 60b in the z-axis direction. In such a case, the springs 66 may be formed to have lengths enough to be elastically stretched according to the height difference between the attachment plate 71 and the pushing plate 73.

Although the pushing plate 73 is formed widely in a shape of the plate on the attachment plate 71 in the first embodiment, the present disclosure is not limited thereto. For example, the pushing plate 73 may be formed to protrude partially only in a portion facing the shift bar 64 on the attachment plate 71. Nevertheless, however, it may be desirable that the cross-sectional area of the pushing plate 73 is larger than that of the shift bar 64 so as to stably shift the shift bar 64 upwards.

Figure 6:
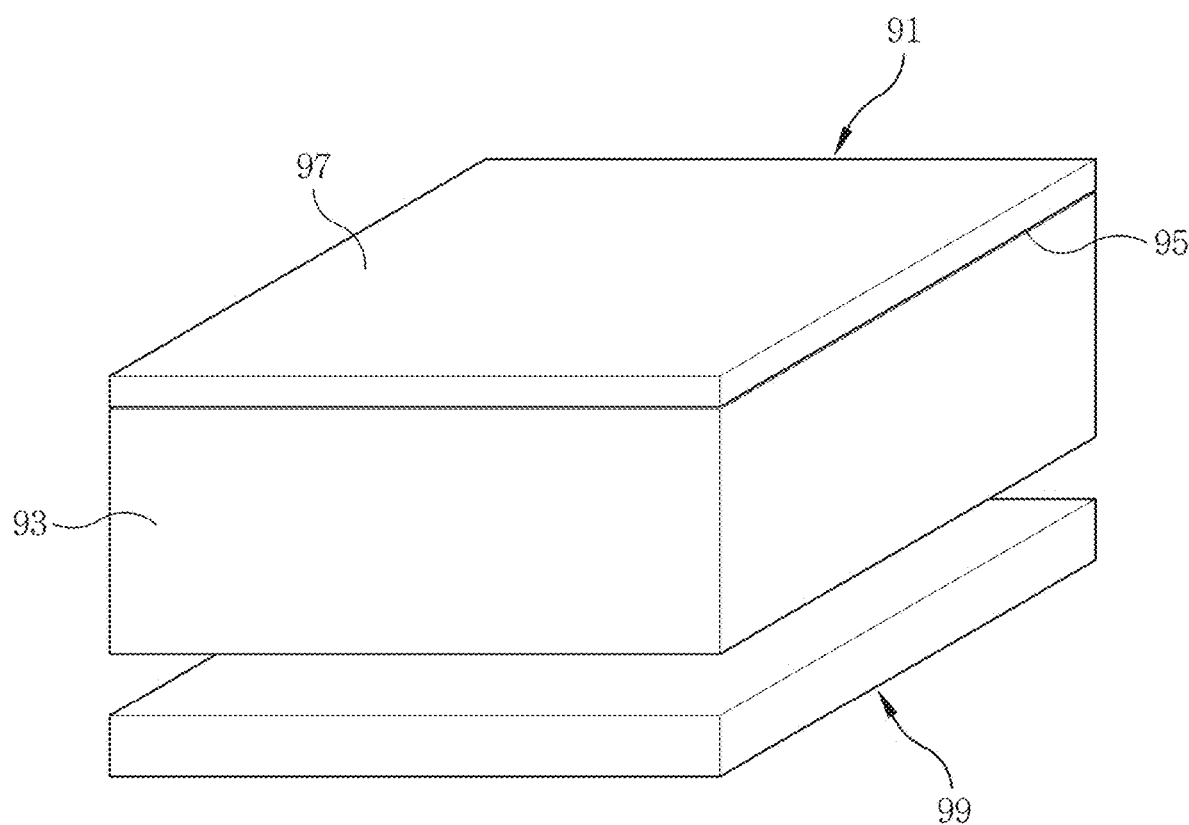
FIGS. 6 through 8 illustrate steps of a process for manufacturing the optical scanner of FIG. 1.
Figure 7:
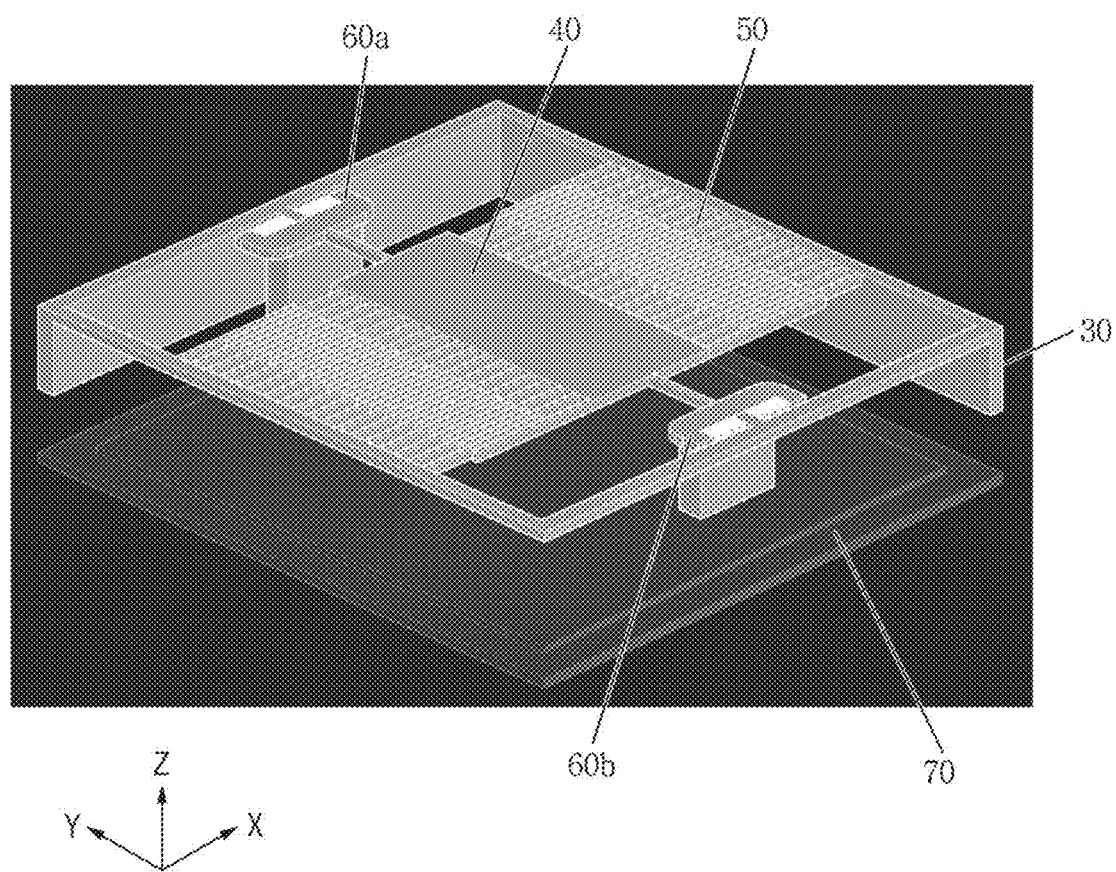
Figure 8:
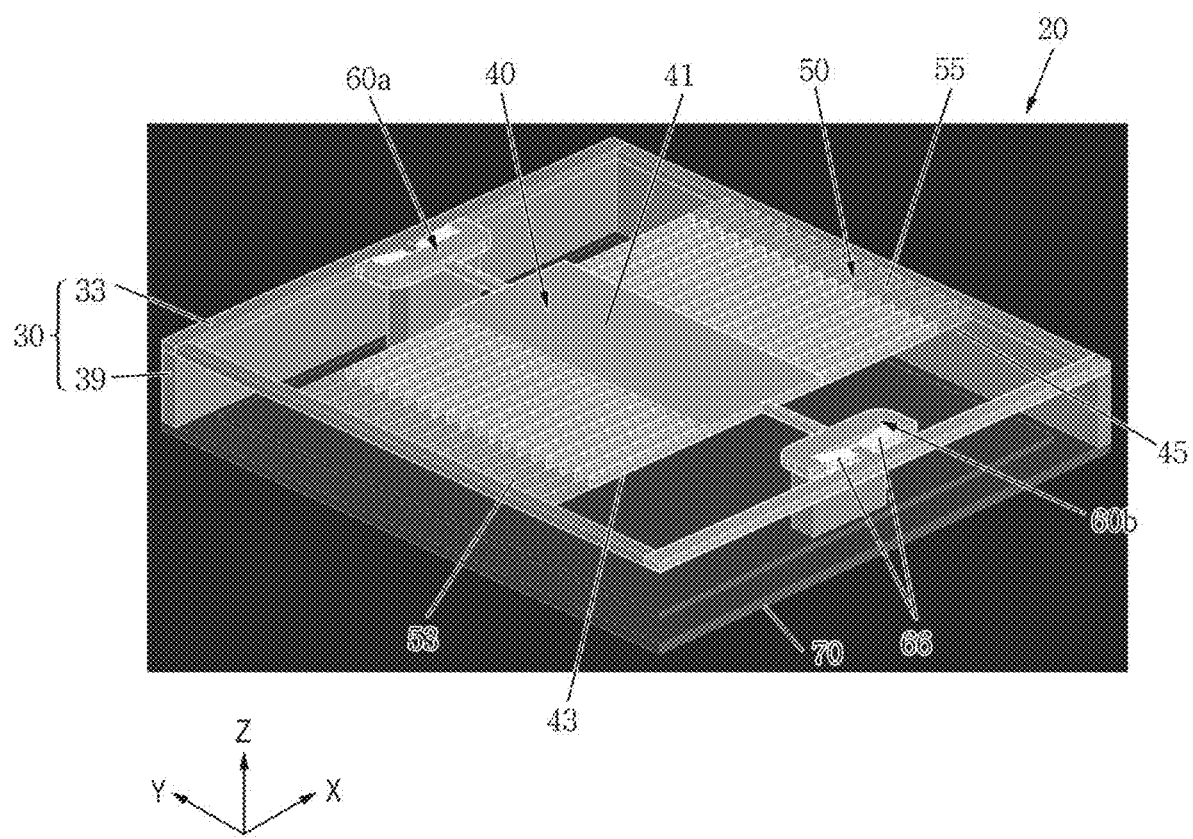

A method of manufacturing the optical scanner 100 according to the first embodiment will now be described with reference to FIGS. 1 and 6-8. FIGS. 6-8 illustrate steps of a process for manufacturing the optical scanner 100 of FIG. 1. In FIGS. 7 and 8, the support frame of the frame 30 is partially cut out in order to show a structure installed in the installation space 31 in the frame 30.

First, a silicon-on-insulator (SOI) substrate 91 and a wafer 99 are prepared as shown in FIGS. 1 and 6. The SOI substrate 91 includes a lower silicon substrate 93 disposed beneath a silicon oxide film 95 and an upper silicon substrate 97 disposed on the silicon oxide film 95. The upper silicon substrate 97 is used to form the drive electrode 40, the stationary electrode 50, the shifters 60a and 60b excluding the shifting bar 64, and the side frame 33, and the upper silicon substrate 97 is used to form the support frame 39 and the shifting bar 64. Here, the lower silicon substrate 93 may be thicker than the upper silicon substrate 97. The wafer 99 is used to form the force application part 70.

Next, as shown in FIGS. 6 and 7, a MEMS fabrication process is performed for on SOI substrate 91 to form the frame 30, the drive electrode 40, the stationary electrode 50, and the shifter 60. During the MEMS fabrication process on the SOI substrate 91, the silicon oxide film 95 serves as an etching stopper. Meanwhile, the MEMS fabrication process is performed for the wafer 99 to form the force application part 70.

The optical scanner 100 including the electrostatic actuator 20 according to the first embodiment may be completed by attaching the force application part 70 to the lower portion of the support frame 39 as shown in FIG. 8. Afterwards, when the force application part 70 attached to the lower part of the support frame 39 pushes the shifters 60a and 60b up in the z-axis direction, the drive electrodes 40 coupled to the shifters 60a and 60b are shifted in the z-axis direction together with the shifters 60a and 60b. As a result, the plurality of drive electrode fingers 43 and 45 coupled to the drive electrode plate 41 are positioned above the plurality of stationary electrode fingers 53 and 55 being displaced apart from each other in the z-axis direction. The first and second shifters 60a and 60b arranged on both sides of the drive electrode 40 elastically support the drive electrode 40 by the pair of springs 66.

As described above, the electrostatic actuator 20 according to the first embodiment vertically shifts the drive electrode 40 from a lower side of the drive electrode 40 to displace the stationary electrode fingers 53 and 55 and the drive electrode fingers 43 and 45 apart from each other. Accordingly, the first embodiment obviates the cover portion disposed on the top of the implementation of the optical scanner discussed above and enables to avoid potential issues that may be caused by a cover portion.

Since the electrostatic actuator 20 according to the first embodiment displaces the stationary electrode fingers 53 and 55 and the drive electrode fingers 43 and 45 apart from each other by a relative vertical motion between them, it is possible to minimize misalignment between the stationary electrode fingers 53 and 55 and the drive electrode fingers 43 and 45 compared with the implementation of the optical scanner discussed above in which the drive electrode fingers are tilted with respect to the stationary electrode fingers.

Further, in case that the drive electrode 40 is vertically shifted with respect to the stationary electrode 50 by the shifters 60a and 60b as in the first embodiment, most of the space occupied by the stationary electrode 50 may be used for both the stationary electrode fingers 53 and 55 and the drive electrode fingers 43 and 45. Thus, the stationary electrode fingers 53 and 55 and the drive electrode fingers 43 and 45 can be formed to be sufficiently long, which may enhance the efficiency of the activation.

On the other hand, although the mirror 10 is attached on the drive electrode plate 41 of the drive electrode 40 according to the first embodiment, the present disclosure is not limited thereto. For example, the actuator may further include a mirror attachment plate to which a mirror is attached, and one or more drive electrode plates may be coupled to both sides of the mirror attachment plate.

Second Embodiment

The first and second drive electrode fingers 43 and 45 are formed in both sides of the drive electrode plate 41 in the first embodiment described above, but the present discloses is not limited thereto. For example, a plurality of drive electrode fingers 43 may be formed only in one side of the drive electrode 40 as shown in FIG. 9.

Figure 9:
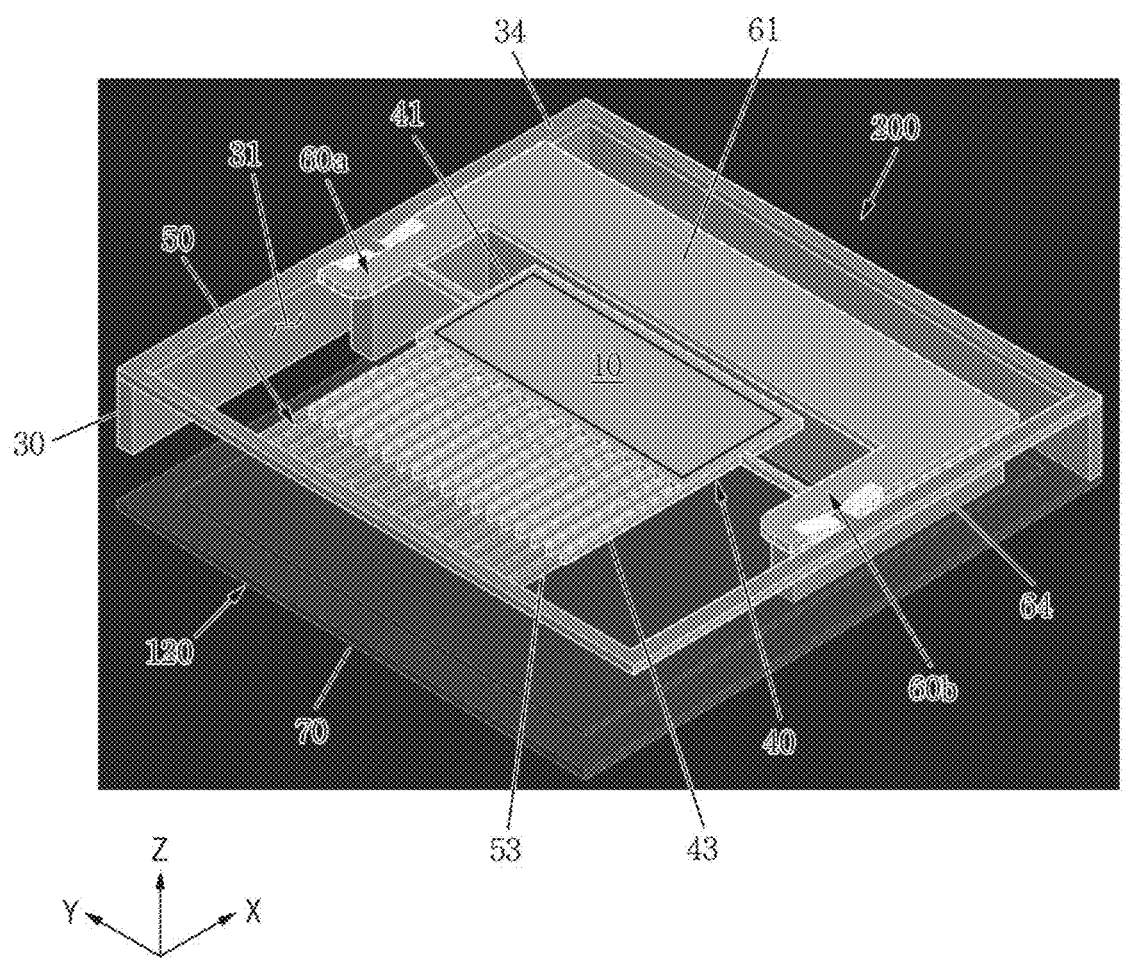
FIG. 9 is a perspective view of an optical scanner having a vertically-shifting electrostatic actuator according to a second embodiment of the present disclosure.

FIG. 9 is a perspective view of an optical scanner 200 having a vertically-shifting electrostatic actuator 120 according to a second embodiment of the present disclosure. In FIG. 9, a support frame of the frame 30 is partially cut out in order to show a structure installed in an installation space 31 in the frame 30.

Referring to FIG. 9, an optical scanner 200 according to the second embodiment of the present disclosure includes the mirror 10 reflecting light and an electrostatic actuator 120 oscillating the mirror 10.

The electrostatic actuator 120 according to the second embodiment includes the frame 30 having the installation space 31 in its central portion, the drive electrode 40, the stationary electrode 50, the shifter 60, and the force application part 70. The drive electrode 40 includes a drive electrode plate 41 on which the mirror 10 is attached, and a plurality of drive electrode fingers 43 extending from a side of the drive electrode plate 41 toward the frame 30 in the installation space 31 of the frame 30. The stationary electrode 50 includes a plurality of stationary electrode fingers 53 disposed alternately with the plurality of drive electrode fingers 43 and 45. The shifters 60a and 60b are coupled to the first side frames 34 and 35 and the drive electrode 40. When a vertical force is applied, the shifters 60a and 60b are shifted vertically to displace the drive electrode 40 connected to the shifters 60a and 60b in the vertical direction. The force application part 70 is disposed below the shifters 60a and 60b to apply the vertical force to the shifters 60a and 60b, so that the shifters 60a and 60b vertically shift the drive electrode 40 connected to the shifters 60a and 60b according to the vertical force.

The electrostatic actuator 120 according to the second embodiment differs from the electrostatic actuator according to the first embodiment in that the plurality of drive electrode fingers 43 are formed only in one side of the drive electrode 40. Therefore, the electrostatic actuator 120 according to the second embodiment is described hereinbelow in terms of its unique configuration while omitting or simplifying repetitive descriptions.

The drive electrode 40 includes the drive electrode plate 41 to which the mirror 10 is attached, and the plurality of drive electrode fingers 43 extending from one side of the drive electrode plate 41. The torsion shafts 47 and 49 extend from the other sides of the drive electrode plate 41 adjacent to the side from which the drive electrode fingers 43 and 45 are extending.

The stationary electrode 50 includes a plurality of stationary electrode fingers 53. The plurality of stationary electrode fingers 53 are disposed to alternate with the plurality of drive electrode fingers 43. The plurality of stationary electrode fingers 53 have one ends coupled to the second side frame 36 and the other ends extending to alternate with the plurality of drive electrode fingers 43.

The shifters 60a and 60b are disposed between the drive electrode 40 and the pair of first side frames 34 and 35 to shift the drive electrode 40 vertically when the vertical force is applied.

The shifters 60a and 60b include a first shifter 60a and a second shifter 60b. The first shifter 60a is disposed between the first torsion shaft 47 and the first side frame 34, and the second shifter 60b is disposed between the second torsion shaft 49 and the first side frame 35.

Each of the first and second shifters 60a and 60b includes the shifting plate 61, a shifting bar 64, a support shaft 65, and a pair of springs 66. The shifting plate 61 is coupled to the torsion shafts 47 and 49 of the drive electrode 40. The shifting bar 64 is disposed under the shifting plate 61 and transfers the vertical force exerted by the force application part 70 to the shifting plate 61. The support shaft 65 has one end coupled to the first side frame 34 or 35 and the other end extending toward the shifting plate 61. The springs 66 extend laterally from the other end of the support shaft 65 and are coupled to the shifting plate 61. When the vertical force is applied to the shifting plate 61, both of the springs 66 may be stretched elastically so that the shifting plate 61 can be shifted in the vertical direction according to the vertical force.

According to the second embodiment, the shifting plate 61 of the first shifter 60a is integrally formed with that of the second shifter 60b. In embodiments, the shifting plate 61 is formed to surround the other sides of the drive electrode plate 41 other than the side from which the plurality of drive electrode fingers 43 are extending. Further, the shifting bar 64 of the first shifter 60a may be integrally formed with that of the second shifter 60b. In such a case, the shifting bar 64 may be formed under the shifting plate 61 to be parallel with the shifting plate 61. For example, in case that the shifting plate 61 is "U"-shaped, the shifting bar 64 may also be "U"-shaped. Alternatively, however, the shifting bar 64 may include a plurality of discrete members rather than having a form of a continuous "U"-shape.

Since the first and second shifters 60a and 60b share the shifting plate 61 supported by the shifting bar 64 in a wide range, the first and second shifters 60a and 60b shifting in the vertical direction may be stably supported by the force application part 70. Accordingly, the first and second shifters 60a and 60b can support the first and second torsion shafts 47 and 49 such that the first and second torsion shafts 47 and 49 stably rotate during the operation of the optical scanner 200. Also, there is an additional advantage of reducing mechanical stresses on the first and second torsion shafts 47 and 49.

Meanwhile, since the drive electrode 43 and the stationary electrode 53 are formed only on one side of the mirror 10 in the optical scanner 200 according to the second embodiment, the mirror 10 may be driven to rotate in an angle range of 0 to +θ degrees.

Third Embodiment although the shifters 60a and 60b are coupled to the drive electrode 40 in the first embodiment, the present disclosure is not limited thereto. For example, the shifters 60a and 60b may be coupled to the stationary electrode 50 as shown in FIGS. 10-12.

Figure 10:
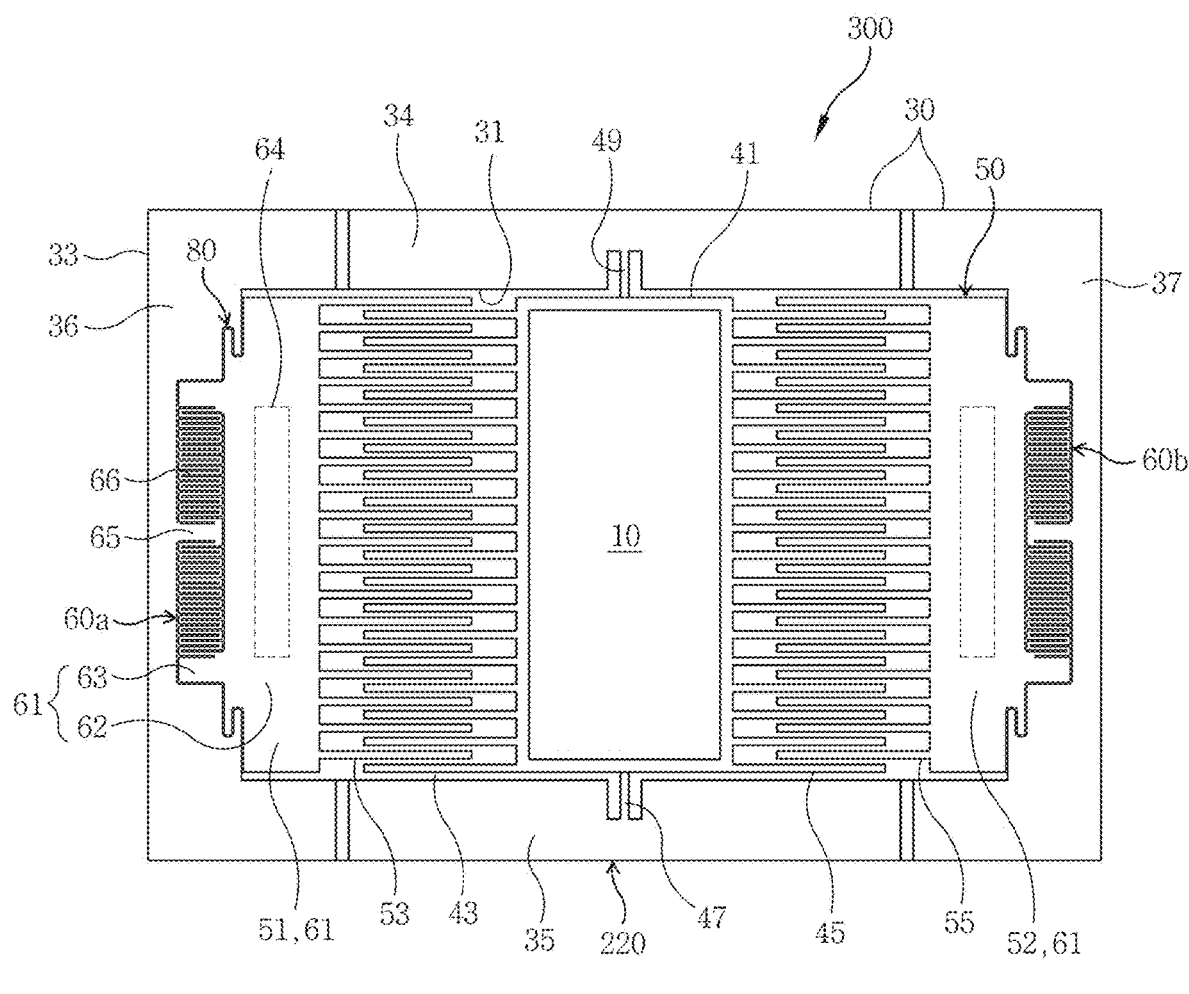
FIG. 10 is a plan view of an optical scanner having a vertically-shifting electrostatic actuator according to a third embodiment of the present disclosure.

FIG. 10 is a plan view of an optical scanner 300 having a vertically-shifting electrostatic actuator 220 according to a third embodiment of the present disclosure. FIG. 11 is an enlarged view of a portion where the shifters 60a and 60b are installed. FIG. 12 is a perspective view showing a state in which the shifters 60a and 60b shown in FIG. 10 are shifted in the vertical direction by the force application part 70.

Figure 11:
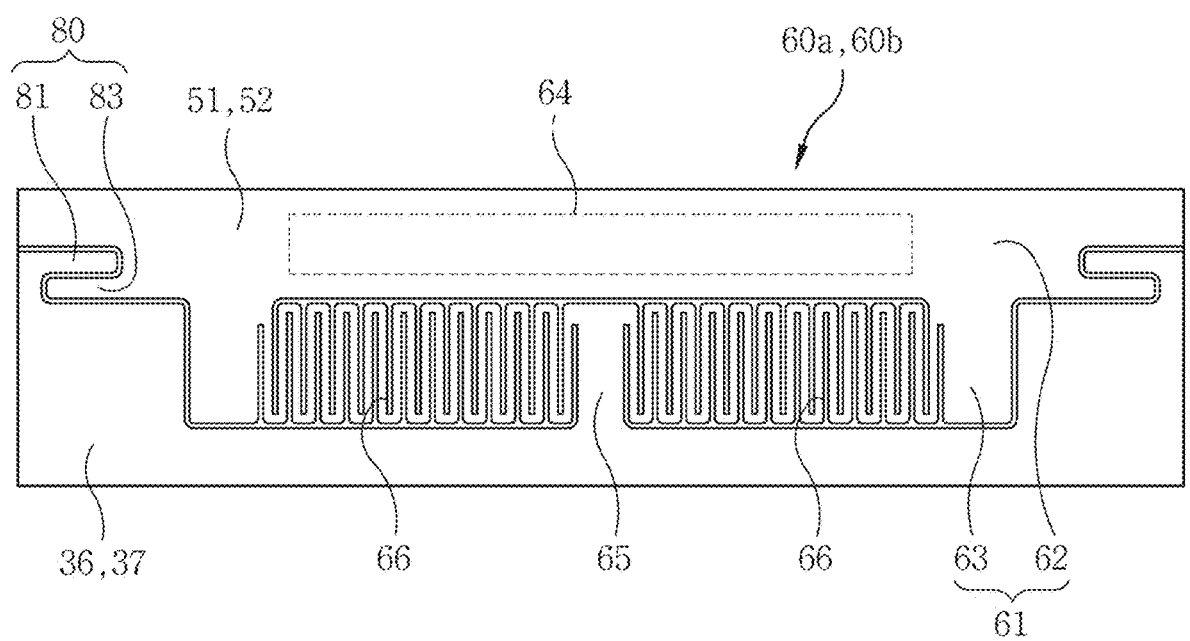
FIG. 11 is an enlarged view of a portion where a shifter shown in FIG. 10 is installed.
Figure 12:
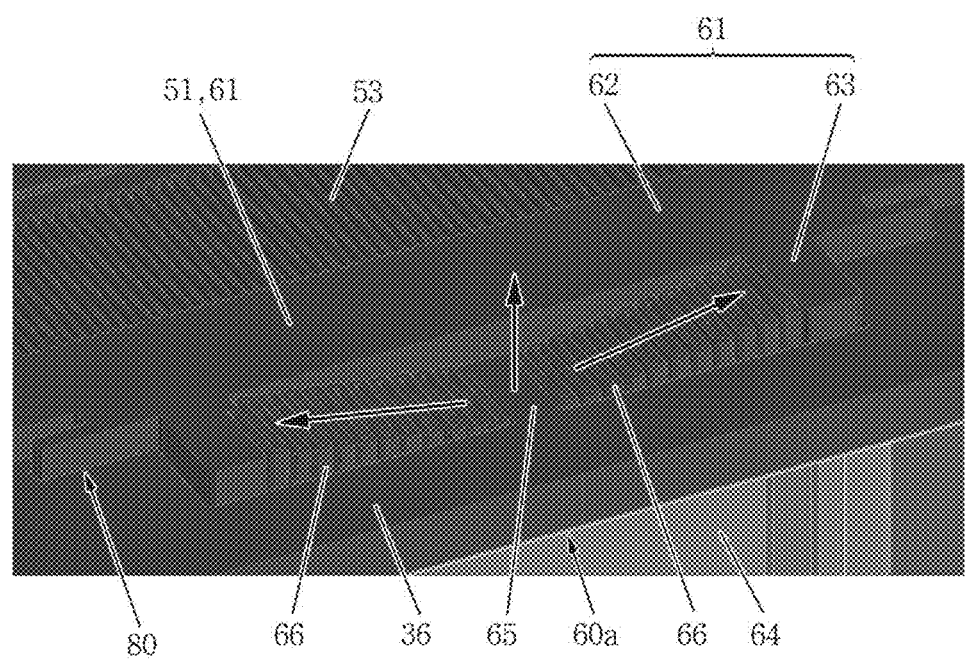
FIG. 12 is a perspective view showing a state in which the shifter shown in FIG. 10 is shifted in the vertical direction by a force application part.

Referring to FIGS. 10-12, an optical scanner 200 according to the third embodiment of the present disclosure includes the mirror 10 reflecting light and an electrostatic actuator 220 oscillating the mirror 10. The electrostatic actuator 220 includes the shifters 60a and 60b coupled to the stationary electrode 50.

The electrostatic actuator 220 according to the first embodiment includes the frame 30 which has the installation space 31 in its central portion. The electrostatic actuator 20 further includes a drive electrode 40, a stationary electrode 50, shifters 60a and 60b, and a force application part 70. The drive electrode 40 includes the drive electrode plate 41 on which the mirror 10 is attached, and the plurality of drive electrode fingers 43 and 45 extending from opposite sides of the drive electrode plate 41. The stationary electrode 50 includes stationary electrode plates 51 and 52, and a plurality of stationary electrode fingers 53 and 55 formed to extend from sides of the stationary electrode plates 51 and 52. The plurality of stationary electrode fingers 53 and 55 are disposed to alternate with the plurality of drive electrode fingers 43 and 45. The shifters 60a and 60b are coupled to the frame 30 and the stationary electrode 50. When the vertical force is applied, the shifters 60a and 60b are shifted vertically to displace the stationary electrode 50 connected to the shifters 60a and 60b vertically. The force application part 70 is disposed below the shifters 60a and 60b to apply the vertical force to the shifters 60a and 60b, so that the shifters 60a and 60b vertically shift the stationary electrode 50 connected to the shifters 60a and 60b according to the vertical force.

The frame 30 has the same structure as that in the first embodiment, and detailed description thereof is omitted for simplicity.

The drive electrode 40 includes the drive electrode plate 41 and the plurality of drive electrode fingers 43 and 45. The plurality of drive electrode fingers 43 and 45 are formed along opposite sides of the drive electrode plate 41. The drive electrode plate 41 is directly to the first side frames 34 and 35 via the torsion shafts 47 and 49.

The stationary electrode 50 includes the stationary electrode plates 51 and 52 and the plurality of stationary electrode fingers 53 and 55. The stationary electrode plates 51 and 52 include the first stationary electrode plate 51 disposed on a side where the plurality of first driving fingers 43 are arranged, and the second stationary electrode plate 52 disposed on the other side where the plurality of second driving fingers 45 are arranged. The plurality of first stationary electrode fingers 53 are formed to extend from the first stationary electrode plate 51 and alternate with the plurality of first driving fingers 43. The second stationary electrode plate 52 are formed to extend from the second stationary electrode plate 52 and alternate with the plurality of second driving fingers 45. The first and second stationary electrode plates 51 and 52 are coupled to the pair of second side frames 36 and 37, respectively, via the first and second shifters 60a and 60b.

As such, the stationary electrode 50 includes a first stationary electrode and a second stationary electrode. The first stationary electrode includes the first stationary electrode plate 51 disposed in a side where the first drive electrode 43 is formed and the first stationary electrode fingers 53. The second stationary electrode includes the second stationary electrode plate 52 disposed in a side where the second drive electrode 45 is formed and the second stationary electrode fingers 55. The first and second stationary electrodes are isolated from each other. The first and second stationary electrodes may be shifted in the z-axis direction by first and second shifters 60a and 60b, respectively.

The shifters 60a and 60b are disposed between the stationary electrode 50 and the pair of second side frames 36 and 37 to shift the stationary electrode 50 vertically when the vertical force is applied. In embodiments, the shifters 60a and 60b shift stationary electrode 50 formed on an xy-plane in the z-axis direction.

The shifters 60a and 60b include a first shifter 60a and a second shifter 60b. The first shifter 60a is disposed between the first stationary electrode fingers 53 and the second side frame 36, and the second shifter 60b is disposed between the second stationary electrode fingers 55 and the second side frame 37.

Each of the first and second shifters 60a and 60b includes the shifting plate 61, a shifting bar 64, a support shaft 65, and a pair of springs 66. The first and second shifters 60a and 60b have a structure similar to that of the first and second shifters in the first embodiment except for some differences in their shapes. Here, the shifting plate 61 of the first and second shifters 60a and 60b also serves as the first and second stationary electrode plates 51 and 52, respectively.

The shifting plate 61 is elongated in the y-axis direction, and the shifting bar 64 is formed to be elongated in the y-axis direction also. Meanwhile, since the shifting bars 64 of the first and second shifters 60a and 60b shift the first and second stationary electrode fingers 53 and 55, respectively, in the z-axis direction, a shake may occur while the first or second stationary finger 53 or 55 is shifted in the z-axis direction. In consideration of this matter, the shifting bars 64 of the first and second shifters 60a and 60b are preferably formed to pass a respective center of gravity of the shifting plate 61 in the y-axis direction.

In addition, the electrostatic driver 220 according to the third embodiment may further include a vertical guide 80 suitable for stably guiding the shifting of the stationary electrode 50 in the z-axis direction. The vertical guide 80 may be formed between the stationary electrode plates 51 and 52 and the second side frames 36 and 37 to guide the vertical shifting of the stationary electrode 50 by the vertical force exerted by the force application part 70. The vertical guide 80 may be implemented by protrusions 81 and 83 formed in the second side frame 36 or 37 and the stationary electrode plate 51 or 52, respectively, and corresponding grooves formed in the stationary electrode plate 51 or 52 and the second side frame 36 or 37. For example, in the example shown in FIG. 11, the vertical guide 80 includes a first protrusion 81 formed in the second side frame 36 and a first groove formed in the stationary electrode plate 51 correspondingly to the first protrusion 81. Also, the vertical guide 80 includes a second protrusion 83 formed in the stationary electrode plate 51 and a second groove formed in the second side frame 36 correspondingly to the second protrusion 83. A plurality of protrusions and a plurality of grooves may be provided alternately.

The vertical guide 80 can suppress undesired movement of the stationary electrode 50 in the x-axis or y-axis direction other than the z-axis direction when the stationary electrode 50 is shifted in the z-axis direction.

Fourth Through Seventh Embodiment

The shifting bar 64 of the shifters 60a and 60b according to the third embodiment has a shape of a straight bar, but the present disclosure is not limited thereto. For example, the shifting bar 64 may be implemented in various shapes as shown in FIGS. 13 to 16.

Fourth Embodiment

Figure 13:
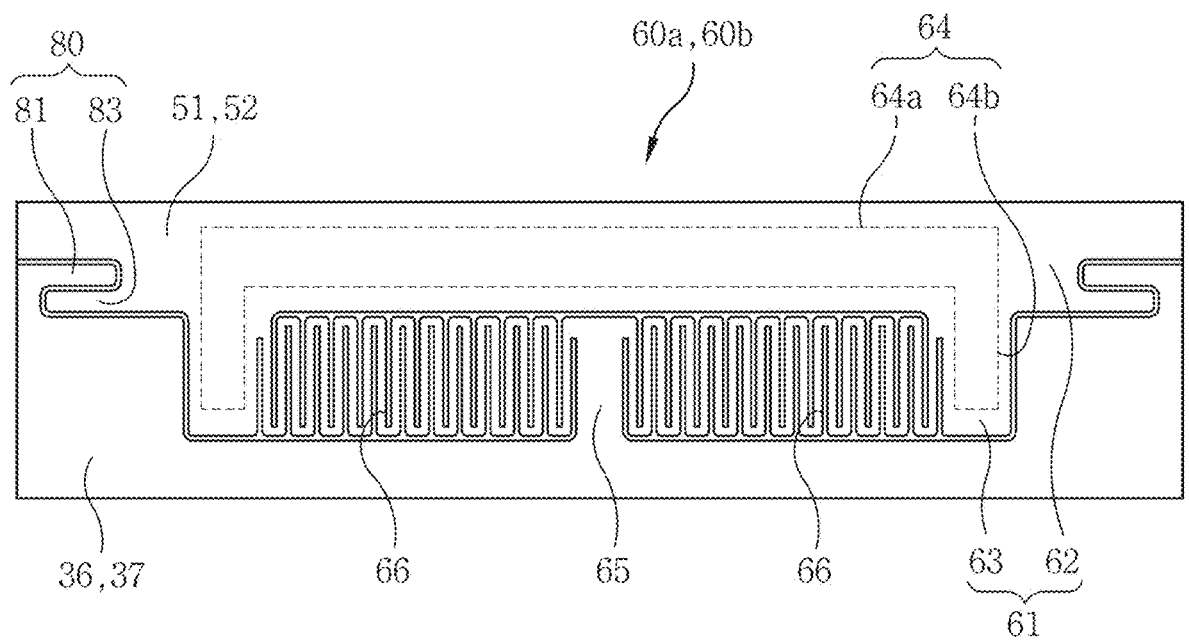
FIG. 13 is an enlarged view of a portion around a shifter is an optical scanner having a vertically-shifting electrostatic actuator according to a fourth embodiment of the present disclosure.

FIG. 13 illustrates a portion around the shifters 60a and 60b in an optical scanner having a vertically-shifting electrostatic actuator according to a fourth embodiment of the present disclosure.

Referring to FIG. 13, the optical scanner according to the fourth embodiment has the same structure as the optical scanner according to the third embodiment except for the shifters 60a and 60b. Thus, only the shifters 60a and 60b are described in detail hereinbelow.

The shifters 60a and 60b include a first shifter 60a and a second shifter 60b. The first shifter 60a is disposed between the first stationary electrode fingers and the second side frame 36, and the second shifter 60b is disposed between the second stationary electrode fingers and the second side frame 37.

Each of the first and second shifters 60a and 60b includes the shifting plate 61, a shifting bar 64, a support shaft 65, and a pair of springs 66. The first and second shifters 60a and 60b have a structure similar to that of the first and second shifters in the first embodiment except for some differences in their shapes. Here, the shifting plate 61 of the first and second shifters 60a and 60b also serves as the first and second stationary electrode plates 51 and 52, respectively.

The shifting plate 61 is elongated in the y-axis direction, and the shifting bar 64 is formed to be elongated in the y-axis direction also. The shifting bar 64 includes a main shifting bar 64a elongated in a straight line in the y-axis direction to be parallel with the direction in which the shifting plate 61 is elongated, and a pair of branch shifting bars 64b extending from both ends of the main shifting bar 64a toward ends of the connecting pieces 63. The pair of branch shifting bars 64b are formed under the connecting pieces 63. Thus, the shifting bar 64 may have an "L"-shape at both ends.

Since the shifting bars 64 of the first and second shifters 60a and 60b shift the first and second stationary electrode fingers 53 and 55, respectively, in the z-axis direction, a shake may occur while the first or second stationary finger 53 or 55 is shifted in the z-axis direction. In consideration of this matter, the main shifting bar 64a is preferably formed to pass a center of gravity of the shifting plate 61 in the y-axis direction. Also, the branch shifting bars 64b are formed to extend from both ends of the main shifting bar 64a toward ends of the connecting pieces 63.

Accordingly, the main shifting bar 64a can stably shift the first and second stationary electrode plates 51 and 52 in the z-axis direction while shifting the stationary electrodes in the z-axis direction.

Also, since the branch shifting bars 64b are arranged on both sides around the support shaft 65, the spring 66 and the connecting pieces 63 are stably shifted in the z-axis direction when the spring 66 is elastically stretched around the support shaft 65 in the process of shifting the stationary electrode in the z-axis direction.

As a result, the stationary electrode can be stably shifted in the z-axis direction by increasing a contact area between the shifting bar 64 and the stationary electrode plates 51 and 52.

Fifth Embodiment

Figure 14:
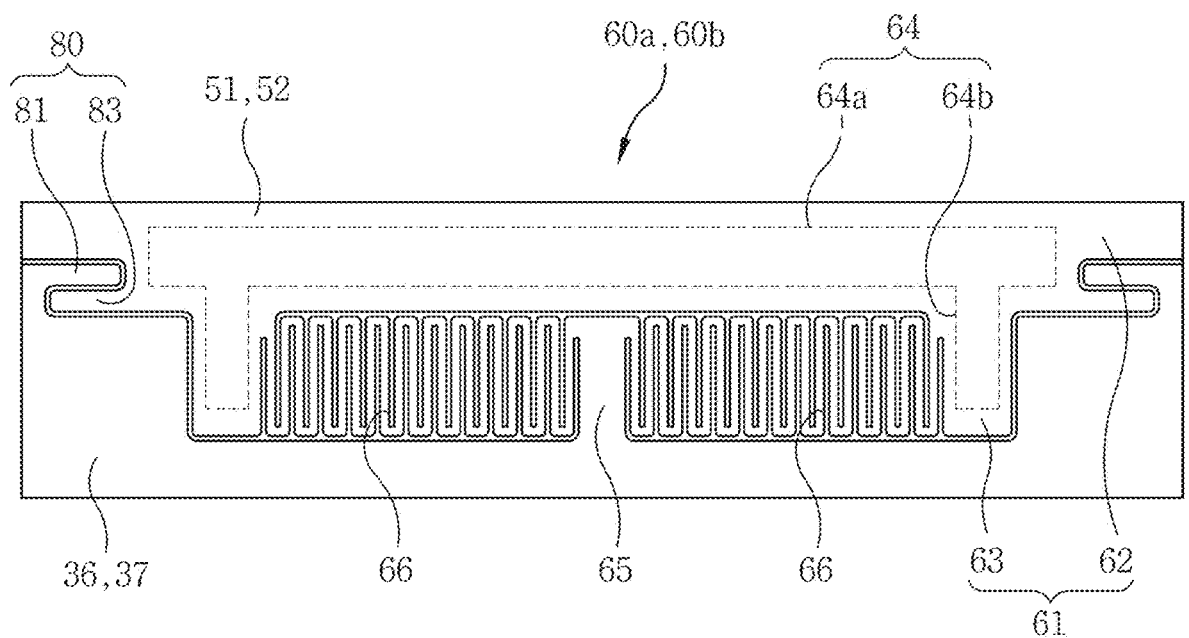
FIG. 14 is an enlarged view of a portion around a shifter is an optical scanner having a vertically-shifting electrostatic actuator according to a fifth embodiment of the present disclosure.

FIG. 14 illustrates a portion around the shifter in an optical scanner having a vertically-shifting electrostatic actuator according to a fifth embodiment of the present disclosure.

Referring to FIG. 14, the optical scanner according to the fifth embodiment has the same structure as the optical scanner according to the third embodiment except for the shifters 60a and 60b. Thus, only the shifters 60a and 60b are described in detail hereinbelow.

Each of the first and second shifters 60a and 60b includes the shifting plate 61, a shifting bar 64, a support shaft 65, and a pair of springs 66. The first and second shifters 60a and 60b have a structure similar to that of the first and second shifters in the first embodiment except for some differences in their shapes. Here, the shifting plate 61 of the first and second shifters 60a and 60b also serves as the first and second stationary electrode plates 51 and 52, respectively.

The shifting plate 61 is elongated in the y-axis direction, and the shifting bar 64 is formed to be elongated in the y-axis direction also. The shifting bar 64 includes a main shifting bar 64a elongated in a straight line in the y-axis direction to be parallel with the direction in which the shifting plate 61 is elongated, and a pair of branch shifting bars 64b each of which extends from a position of the main shifting bar 64a near the end thereof toward the end of the connecting piece 63. The pair of branch shifting bars 64b are formed under the connecting pieces 63. Thus, the shifting bar 64 may have a "T"-shape at an intersection of main shifting bar 64a and the branch shifting bar 64b.

Since the shifting bars 64 of the first and second shifters 60a and 60b shift the first and second stationary electrode fingers 53 and 55, respectively, in the z-axis direction, a shake may occur while the first or second stationary finger 53 or 55 is shifted in the z-axis direction. In consideration of this matter, the main shifting bar 64a is preferably formed to pass a center of gravity of the shifting plate 61 in the y-axis direction. Also, each of the branch shifting bars 64b is formed to extend from a position of the main shifting bar 64a near the end thereof toward the end of the connecting piece 63.

Accordingly, the main shifting bar 64a can stably shift the first and second stationary electrode plates 51 and 52 in the z-axis direction while shifting the stationary electrodes in the z-axis direction.

Also, since the branch shifting bars 64b are arranged on both sides around the support shaft 65, the spring 66 and the connecting pieces 63 are stably shifted in the z-axis direction when the spring 66 is elastically stretched around the support shaft 65 in the process of shifting the stationary electrode in the z-axis direction.

As a result, the stationary electrode can be stably shifted in the z-axis direction by increasing a contact area between the shifting bar 64 and the stationary electrode plates 51 and 52.

Sixth Embodiment

Figure 15:
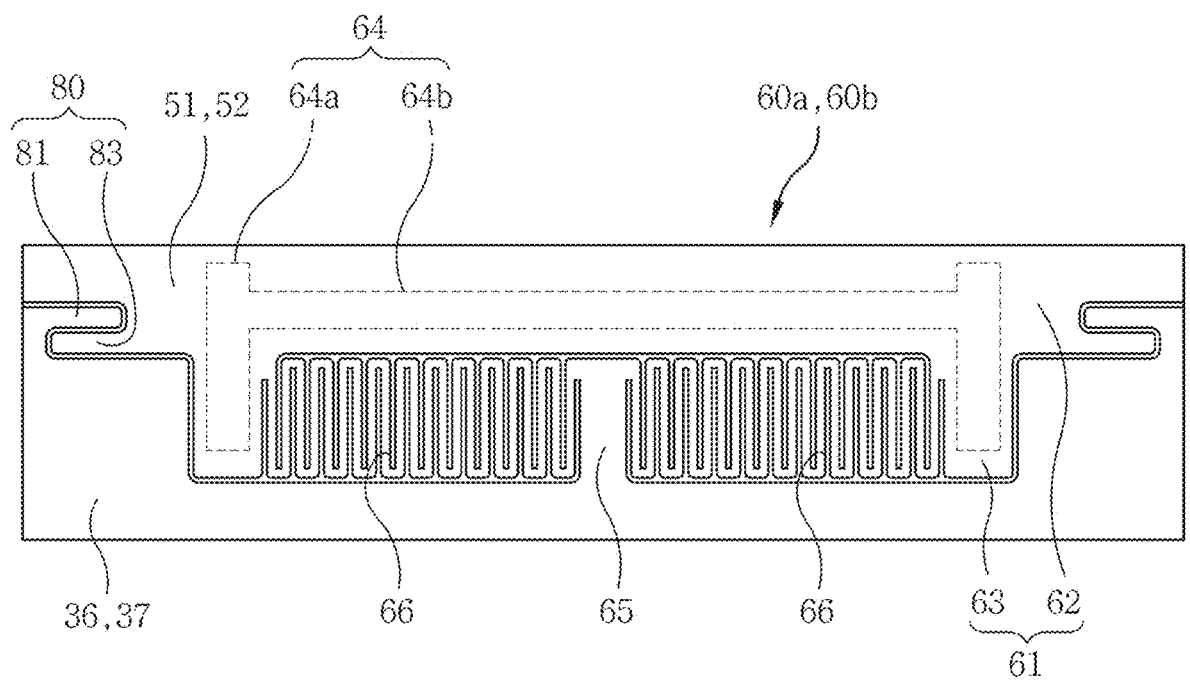
FIG. 15 is an enlarged view of a portion around a shifter is an optical scanner having a vertically-shifting electrostatic actuator according to a sixth embodiment of the present disclosure.

FIG. 15 illustrates a portion around the shifter in an optical scanner having a vertically-shifting electrostatic actuator according to a sixth embodiment of the present disclosure.

Referring to FIG. 15, the optical scanner according to the sixth embodiment has the same structure as the optical scanner according to the third embodiment except for the shifters 60a and 60b. Thus, only the shifters 60a and 60b are described in detail hereinbelow.

Each of the first and second shifters 60a and 60b includes the shifting plate 61, a shifting bar 64, a support shaft 65, and a pair of springs 66. The first and second shifters 60a and 60b have a structure similar to that of the first and second shifters in the first embodiment except for some differences in their shapes. Here, the shifting plate 61 of the first and second shifters 60a and 60b also serves as the first and second stationary electrode plates 51 and 52, respectively.

The shifting plate 61 is elongated in the y-axis direction, and the shifting bar 64 is formed to be elongated in the y-axis direction also. The shifting bar 64 includes a main shifting bar 64a elongated in a straight line in the y-axis direction to be parallel with the direction in which the shifting plate 61 is elongated, and a pair of branch shifting bars 64b each of which extends to both sides, i.e. toward the stationary electrode and the end of the connecting piece 63, from an end of the main shifting bar 64a. Each of the pair of branch shifting bars 64b include a first branch shifting bar extending from one end of the main shifting bar 64a toward the end of the connecting piece 63 and a second branch shifting bar extending from the end of the main shifting bar 64a toward the stationary electrode. The first and second branch shifting bars are disposed oppositely from the end of the main shift bar 64a. The first branch shifting bar is formed under the connecting piece 63. Thus, the shifting bar 64 may generally have a "H"-shape.

Since the shifting bars 64 of the first and second shifters 60a and 60b shift the first and second stationary electrode fingers 53 and 55, respectively, in the z-axis direction, a shake may occur while the first or second stationary finger 53 or 55 is shifted in the z-axis direction. In consideration of this matter, the main shifting bar 64a is preferably formed to pass a center of gravity of the shifting plate 61 in the y-axis direction. Also, each of the branch shifting bars 64b is formed to extend to both sides, i.e. toward the stationary electrode and the end of the connecting piece 63, from the both end of the main shifting bar 64a.

Accordingly, the main shifting bar 64a can stably shift the first and second stationary electrode plates 51 and 52 in the z-axis direction while shifting the stationary electrodes in the z-axis direction. At this time, since the first and second stationary electrode plates 51 and 52 are supported by the main shifting bar 64a as well as the pair of branch shifting bars 64b coupled to the main shifting bar 64a, the width of the main shifting bar 64b may be formed to be narrower than those of the main shifting bars 64b according to the fourth and fifth embodiments.

Also, since the branch shifting bars 64b are arranged on both sides around the support shaft 65, the spring 66 and the connecting pieces 63 are stably shifted in the z-axis direction when the spring 66 is elastically stretched around the support shaft 65 in the process of shifting the stationary electrode in the z-axis direction.

As a result, the stationary electrode can be stably shifted in the z-axis direction by increasing a contact area between the shifting bar 64 and the stationary electrode plates 51 and 52.

Seventh Embodiment

Figure 16:
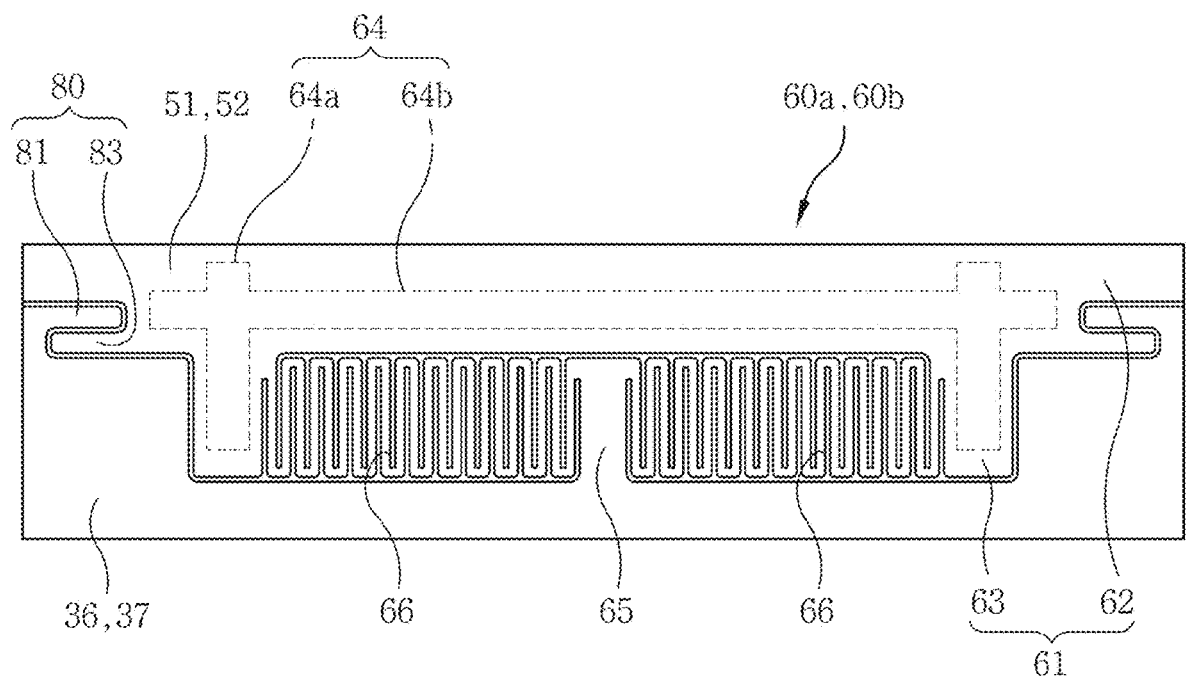
FIG. 16 is an enlarged view of a portion around a shifter is an optical scanner having a vertically-shifting electrostatic actuator according to a seventh embodiment of the present disclosure.

FIG. 16 illustrates a portion around the shifter in an optical scanner having a vertically-shifting electrostatic actuator according to a seventh embodiment of the present disclosure.

Referring to FIG. 16, the optical scanner according to the seventh embodiment has the same structure as the optical scanner according to the third embodiment except for the shifters 60a and 60b. Thus, only the shifters 60a and 60b are described in detail hereinbelow.

Each of the first and second shifters 60a and 60b includes the shifting plate 61, a shifting bar 64, a support shaft 65, and a pair of springs 66. The first and second shifters 60a and 60b have a structure similar to that of the first and second shifters in the first embodiment except for some differences in their shapes. Here, the shifting plate 61 of the first and second shifters 60a and 60b also serves as the first and second stationary electrode plates 51 and 52, respectively.

The shifting plate 61 is elongated in the y-axis direction, and the shifting bar 64 is formed to be elongated in the y-axis direction also. The shifting bar 64 includes a main shifting bar 64a elongated in a straight line in the y-axis direction to be parallel with the direction in which the shifting plate 61 is elongated, and a pair of branch shifting bars 64b each of which extends to both sides, i.e. toward the stationary electrode and the end of the connecting piece 63, from a position of the main shifting bar 64a near the end thereof. Each of the pair of branch shifting bars 64b include a first branch shifting bar extending from the position of the main shifting bar 64a near the end thereof toward the end of the connecting piece 63 and a second branch shifting bar extending from the position of the main shifting bar 64a near the end thereof toward the stationary electrode. The first and second branch shifting bars are disposed oppositely from the position of the main shifting bar 64a near the end thereof. The first branch shifting bar is formed under the connecting piece 63. Thus, the shifting bar 64 may have a "cross (+)"-shape at the position of the main shifting bar 64a near the end thereof, i.e. at the intersection of the main shifting bar 64a and each of the branch shifting bars 64b.

Since the shifting bars 64 of the first and second shifters 60a and 60b shift the first and second stationary electrode fingers 53 and 55, respectively, in the z-axis direction, a shake may occur while the first or second stationary finger 53 or 55 is shifted in the z-axis direction. In consideration of this matter, the main shifting bar 64a is preferably formed to pass a center of gravity of the shifting plate 61 in the y-axis direction. Also, each of the branch shifting bars 64b is formed to extend to both sides, i.e. toward the stationary electrode and the end of the connecting piece 63, from the intersection of the main shifting bar 64a and each of the branch shifting bars 64b.

Accordingly, the main shifting bar 64a can stably shift the first and second stationary electrode plates 51 and 52 in the z-axis direction while shifting the stationary electrodes in the z-axis direction. At this time, since the first and second stationary electrode plates 51 and 52 are supported by the main shifting bar 64a as well as the pair of branch shifting bars 64b coupled to the main shifting bar 64a, the width of the main shifting bar 64b may be formed to be narrower than those of the main shifting bars 64b according to the fourth and fifth embodiments.

Also, since the branch shifting bars 64b are arranged on both sides around the support shaft 65, the spring 66 and the connecting pieces 63 are stably shifted in the z-axis direction when the spring 66 is elastically stretched around the support shaft 65 in the process of shifting the stationary electrode in the z-axis direction.

As a result, the stationary electrode can be stably shifted in the z-axis direction by increasing a contact area between the shifting bar 64 and the stationary electrode plates 51 and 52.

As described above, according to the fourth to seventh embodiments, the shifting bar 64 for vertically shifting the stationary electrode plates 51 and 52 of the stationary electrode may be provided in various shapes such as the "L"-shape, "T"-shape, "H"-shape, "cross (+)" shape, and so on, according to the shape of the stationary electrode plates 51 and 52. Such a shifting bar 64 can stably shift the stationary electrode while suppressing a tilting of the stationary electrode in a certain direction in the process of vertically shifting the stationary electrode.

The description of the disclosure is merely example in nature and, thus, variations that do not depart from the substance of the disclosure are intended to be within the scope of the disclosure. Such variations are not to be regarded as a departure from the spirit and scope of the disclosure.

What is claimed is:

1. A vertically-shifting electrostatic actuator for use in an optical scanner, comprising:
   a frame having an installation space in a central portion;
   a drive electrode coupled to a mirror in the installation space of the frame, and comprising a drive electrode plate and a plurality of drive electrode fingers formed at an outer side of the drive electrode plate;
   a stationary electrode coupled to the frame in the installation space of the frame and comprising a plurality of stationary electrode fingers disposed alternately with the plurality of drive electrode fingers;
   a shifter connected between the frame and the drive electrode and configured to vertically shift the drive electrode connected to the shifter when a vertical force is applied; and
   a force application part disposed below the shifter and configured to apply the vertical force to the shifter so that the shifter vertically shifts the drive electrode connected to the shifter,
   wherein the shifter comprises:
      a shifting plate coupled to the drive electrode;
      a shifting bar disposed under the shifting plate to transfer the vertical force exerted by the force application part to the shifting plate;
      a support shaft having one end coupled to the frame and the other end extending toward the shifting plate; and
      a pair of springs arranged between the other end of the support shaft and the shifting plate and configured to be stretched elastically to allow the shifting plate to shift vertically when the vertical force is applied to the shifting plate, and
   wherein the shifting bar comprises:
      a main shifting bar elongated in a direction in which the plurality of stationary electrode fingers extend; and
      a pair of branch shifting bars extending from the main shifting bar in a direction parallel with an axis of the support shaft.

2. The vertically-shifting electrostatic actuator of claim 1, wherein each of the branch shifting bars comprises:
   a portion connected to an end of the main shifting bar and extending toward an area where the plurality of stationary electrode fingers are formed.

3. The vertically-shifting electrostatic actuator of claim 1, wherein the shifting bar has a shape selected from a group consisting of "L"-shape, "T"-shape, "H"-shape, cross shape, and a combination thereof at intersections of the main shifting bar and the branch shifting bar.

4. The vertically-shifting electrostatic actuator of claim 1, wherein the shifting plate comprises:
   a body plate under which the shifting bar is disposed; and
   a pair of connecting pieces protruding from both ends of the body plate to be parallel with the support shaft and coupled to respective one of the springs.

5. The vertically-shifting electrostatic actuator of claim 4, wherein the pair of branch shifting bars are formed under the pair of connecting pieces.

6. The vertically-shifting electrostatic actuator of claim 4, wherein the pair of springs are zigzag-bent springs arranged symmetrically with respect to the support shaft.

7. The vertically-shifting electrostatic actuator of claim 6, wherein the force application part comprises:
   an attachment plate attached to a lower portion of the frame; and
   a pushing plate positioned within the installation space of the frame and protruding from an upper surface of the attachment plate and configured to push the shifting bar upwards so that the shifter is shifted vertically.

8. The vertically-shifting electrostatic actuator of claim 1, wherein the mirror is attached on the drive electrode plate.

9. The vertically-shifting electrostatic actuator of claim 1, wherein the drive electrode plate is coupled to the mirror.

10. The vertically-shifting electrostatic actuator of claim 1, wherein the stationary electrode comprises:
    a stationary electrode plate disposed to face an outer surface of the drive electrode plate on which the plurality of drive electrode fingers are formed; and
    the plurality of stationary electrode fingers formed on the stationary electrode plate and disposed alternately with the plurality of drive electrode fingers, and
    wherein the stationary electrode plate also serves as the shifting plate.

11. The vertically-shifting electrostatic actuator of claim 10, further comprising:
    a vertical guide formed between the stationary electrode plate and the frame to guide the vertical shifting of the stationary electrode driven by the force application part.

12. The vertically-shifting electrostatic actuator of claim 11, wherein the vertical guide comprises at least one protrusion formed in the stationary electrode plate or the frame and at least one groove formed in the frame or the stationary electrode plate correspondingly to the at least one protrusion.

13. An optical scanner comprising:
    a mirror configured to reflect an incident light; and
    an electrostatic actuator configured to oscillate the mirror, wherein the electrostatic actuator comprises:
       a frame having an installation space in a central portion;
       a drive electrode coupled to the mirror in the installation space of the frame, and comprising a drive electrode plate and a plurality of drive electrode fingers formed at an outer side of the drive electrode plate;

a stationary electrode coupled to the frame in the installation space of the frame and comprising a plurality of stationary electrode fingers disposed alternately with the plurality of drive electrode fingers;

a shifter connected between the frame and the drive electrode and configured to vertically shift the drive electrode connected to the shifter when a vertical force is applied; and a force application part disposed below the shifter and configured to apply the vertical force to the shifter so that the shifter vertically shifts the drive electrode connected to the shifter, wherein the shifter comprises:

a shifting plate coupled to the drive electrode or the stationary electrode;

a shifting bar disposed under the shifting plate to transfer the vertical force exerted by the force application part to the shifting plate;

a support shaft having one end coupled to the frame and the other end extending toward the shifting plate; and a pair of springs arranged between the other end of the support shaft and the shifting plate and configured to be stretched elastically to allow the shifting plate to shift vertically when the vertical force is applied to the shifting plate, and wherein the shifting bar comprises:

a main shifting bar elongated in a direction in which the plurality of stationary electrode fingers extend; and a pair of branch shifting bars extending from the main shifting bar in a direction parallel with an axis of the support shaft.

* * * * *